US006611944B2

(12) United States Patent
Elzinga

(10) Patent No.: US 6,611,944 B2
(45) Date of Patent: Aug. 26, 2003

(54) CALCULATING INTERCONNECT SWIZZLING PATTERNS FOR CAPACITIVE AND INDUCTIVE NOISE CANCELLATION

(75) Inventor: Mark Elzinga, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 10/040,766

(22) Filed: Dec. 28, 2001

(65) Prior Publication Data

US 2003/0126564 A1 Jul. 3, 2003

(51) Int. Cl.[7] .............................................. G06F 17/50
(52) U.S. Cl. .................... 716/2; 716/5; 716/14
(58) Field of Search .................. 174/27; 179/174; 379/414; 455/63; 716/2, 5, 14

(56) References Cited

U.S. PATENT DOCUMENTS

| | | | | |
|---|---|---|---|---|
| 3,932,713 A | * | 1/1976 | Fleuchaus et al. | 379/415 |
| 5,953,412 A | * | 9/1999 | Sheets et al. | 379/414 |
| 6,202,194 B1 | | 3/2001 | Seningen et al. | |
| 6,211,456 B1 | | 4/2001 | Seningen et al. | |

OTHER PUBLICATIONS

Guoan Zhong, Cheng–Kok Koh, Kauskik Roy, "A Twisted–Bundle Layout Structure for Minimizing Inductive Coupling Noise," International Conference on Computer–Aided Design, Nov. 5–9, 2000, School of Electrical and Computer Engineering, Purdue University, West Lafayette, IN 47907–1285.

* cited by examiner

Primary Examiner—Matthew Smith
Assistant Examiner—Thuan Do
(74) Attorney, Agent, or Firm—Blakely, Sokoloff, Taylor & Zafman LLP

(57) ABSTRACT

Disclosed herein are swizzling techniques that may provide capacitive and inductive noise cancellation on a set of signal lines. Positive noise due to a capacitive coupling between attacker signal lines and near victim signal lines is, in part, cancelled by negative noise due to inductive coupling between the attacker signal lines and a far victim signal line. Swizzling patterns and repeatable swizzling patterns are computed to transpose near victim signal lines and far victim signal lines in subsequent segments to facilitate the capacitive and inductive cancellation. The signal lines are optionally reordered by computing a final swizzling to restore the set's original ordering.

35 Claims, 30 Drawing Sheets

US 6,611,944 B2

CALCULATING INTERCONNECT SWIZZLING PATTERNS FOR CAPACITIVE AND INDUCTIVE NOISE CANCELLATION

FIELD OF THE DISCLOSURE

This disclosure relates generally to the field of interconnect systems and circuits for transmission of digital data. In particular, the disclosure relates to line swizzling which may result in the reduction of inductive and capacitive noise on multiple-line interconnects.

BACKGROUND OF THE DISCLOSURE

As signals in electronic devices switch at higher and higher frequencies, maintaining the integrity of these signals becomes an increasingly difficult problem. High frequency signaling and smaller feature sizes made possible by advanced processing techniques increase the importance of signal integrity and signal timing. Additionally, wider bus interconnects, faster switching rates and higher scales of integration increase the potential for signal noise and related failures.

Capacitive coupling and inductive coupling of concurrently switched signal lines may combine to produce worst-case signal noise that results in one or more noise failures or noise-induced timing failures.

Techniques such as shielding and line reordering have been used, especially to reduce the short-range effects of capacitive coupling. Inductive shielding, consisting of fixed-potential or ground lines between sets of signal lines, has also been used, especially in higher metal layers but shielding lines (or return lines) consume signal tracks and can be costly, especially in interconnect-limited designs.

Insertion of repeaters has been used to improve signal integrity and limit noise effects, but repeaters also require additional area and have a further drawback of consuming additional power.

Isolating signal lines between two metal planes has been used in some commercial processor designs to limit on-chip inductive coupling, but may require that relatively large areas of existing metal layers or even additional metal layers be used as isolating metal planes.

Reordering a set of signal lines with respect to a shared return line has been shown to reduce inductive coupling between the reordered set and another set of signal lines, but this technique alone has not previously been shown to be effective in reducing the inductance within the reordered set. Further, this technique requires at least as many reordering stages as signal lines in the reordered set.

BRIEF DESCRIPTION OF THE DRAWINGS

The present invention is illustrated by way of example and not limitation in the figures of the accompanying drawings.

DETAILED DESCRIPTION

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

Disclosed herein is a process to employ swizzling that may provide capacitive and inductive noise cancellation on a set of signal lines. A positive noise due to a capacitive coupling between an attacker signal line and a first victim signal line is, in part, cancelled by a negative or opposite noise due to an inductive coupling between the attacker signal line and a second victim signal line. A swizzling pattern is set forth whereby signal lines of one segment are reordered to place the first signal line adjacent to the second signal line in a subsequent segment in order to facilitate the capacitive and inductive cancellation. The swizzling pattern is selected to further facilitate similar capacitive and inductive cancellation among the other signal lines of the set. The process continues to employ the swizzling pattern in multiple stages to place the first signal line adjacent to the rest of the signal lines of the set in subsequent stages. The signal lines are optionally reordered by a final swizzle stage to restore the set's original order.

For the purpose of the following discussion a swizzling of a set of signal lines is accomplished by reordering one or more signal line elements of the set. For example, if a set of n signal lines has an order expressed as {1,2,3,4, ... n} then the reordered set {1,3,2,4, ... n} is a swizzling of the set, which transposes signal lines 2 and 3. This transposition may also be written (2,3) or (3,2). A swizzling of a set of n signal lines may be alternatively expressed as a composition of transpositions. Any one of several different compositions of transpositions may be used to express a given swizzling. For example, the reordered set of six signal lines given by {2,3,1,6,4,5} may be expressed, with respect to an initial ordered set {1,2,3,4,5,6}, as the product (1,2)(2,3)(5,6)(4,5) or as the product (2,3)(1,3)(4,6)(5,6) which are equivalent expressions. The swizzled signal line positions may be computed by applying transpositions (from right to left) to the initial ordered set as follows:

$$(1,2)(2,3)(5,6)(4,5)\{1,2,3,4,5,6\} = (1,2)(2,3)(5,6)\{1,2,3,5,4,6\}$$

$$= (1,2)(2,3)\{1,2,3,6,4,5\}$$

$$= (1,2)\{1,3,2,6,4,5\}$$

$$= \{2,3,1,6,4,5\}.$$

Figure 1:
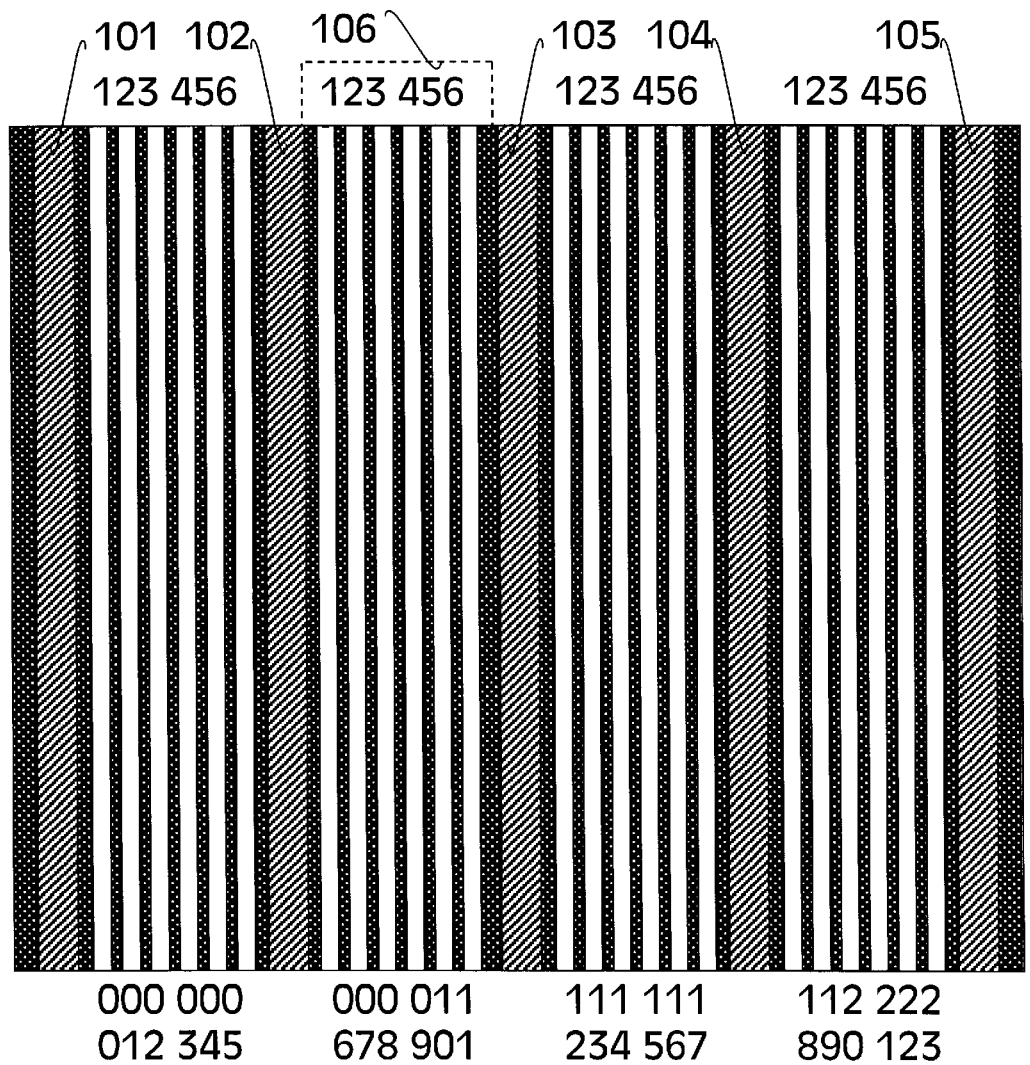
FIG. 1 illustrates an interconnect segment having four sets of six signal lines shielded by one return line.

An interconnect segment may be divided into sets of signal lines. These sets of signal lines may also be shielded by return lines. FIG. 1 illustrates, for example, an interconnect segment having four sets of six signal lines shielded by one return line. The signal lines of the interconnect are numbered 00–23 (see bottom of FIG. 1, numbering 00–23 from left to right) and each of the sets of signal lines are numbered 1–6 corresponding to an initial order of the signal line elements of the set. Return lines 101–105 shield the sets of signal lines. For example, set 106, comprising the six signal lines 06–11, has an initial order 1–6 of signal line elements: 1 corresponding to signal line 06, 2 corresponding to signal line 07, ... and 6 corresponding to signal line 11. Set 106 is shielded on the left by return line 102 and on the right by return line 103.

For the purpose of the following discussion a signal line that is adjacent to a return line on one side and adjacent to another signal line of the set on the other side may be referred to as half-shielded. In order to better illustrate techniques of the present disclosure, signal lines of the same set are assumed to be concurrently active, meaning that each signal line of the set may be switched concurrently in a transmission cycle. A signal to return ratio is the number of signal lines per return line of the interconnect. FIG. 1, for example has a signal to return ratio of 6:1. A signal line that is being switched from a first voltage state to a second voltage state, different from the first, may be referred to as an attacker signal line. Accordingly, a signal line that is a recipient of noise through a capacitive coupling or an inductive coupling with an attacker signal line may be referred to as a victim signal line.

It will be appreciated that if a first signal line is adjacent to a second signal line that is not switched concurrently with the first signal line, then the first signal line may be considered additionally shielded by the second signal line. Such considerations may also be taken into account by one skilled in the art without departing from the broader spirit and scope of the invention claimed.

Figure 2A:
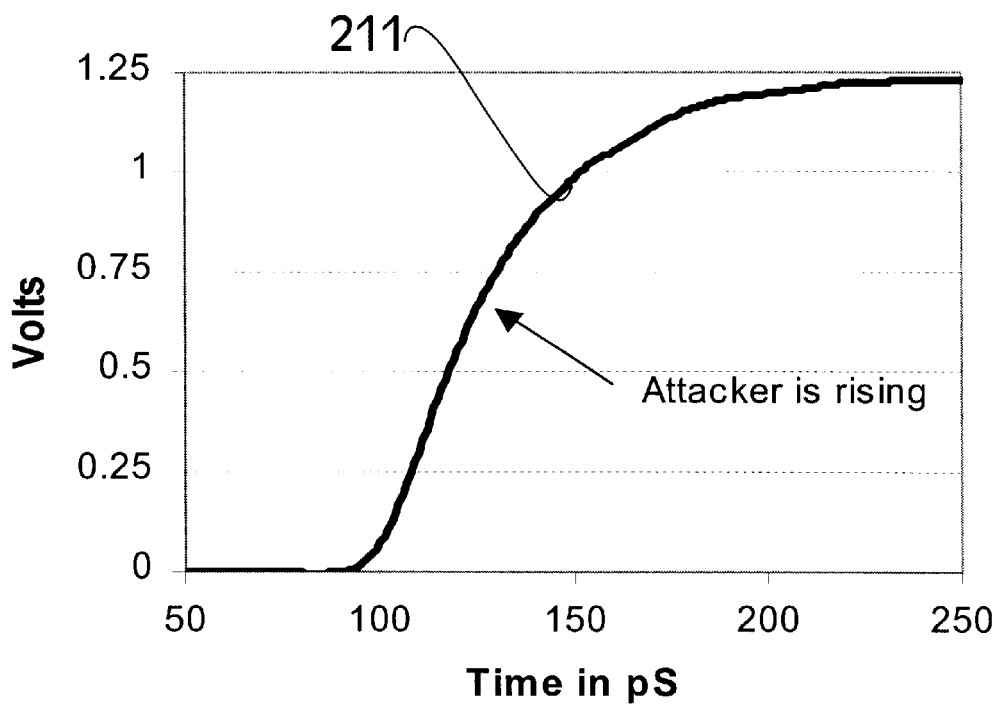
FIG. 2a illustrates a rising voltage over time for an attacker signal line.
Figure 2B:
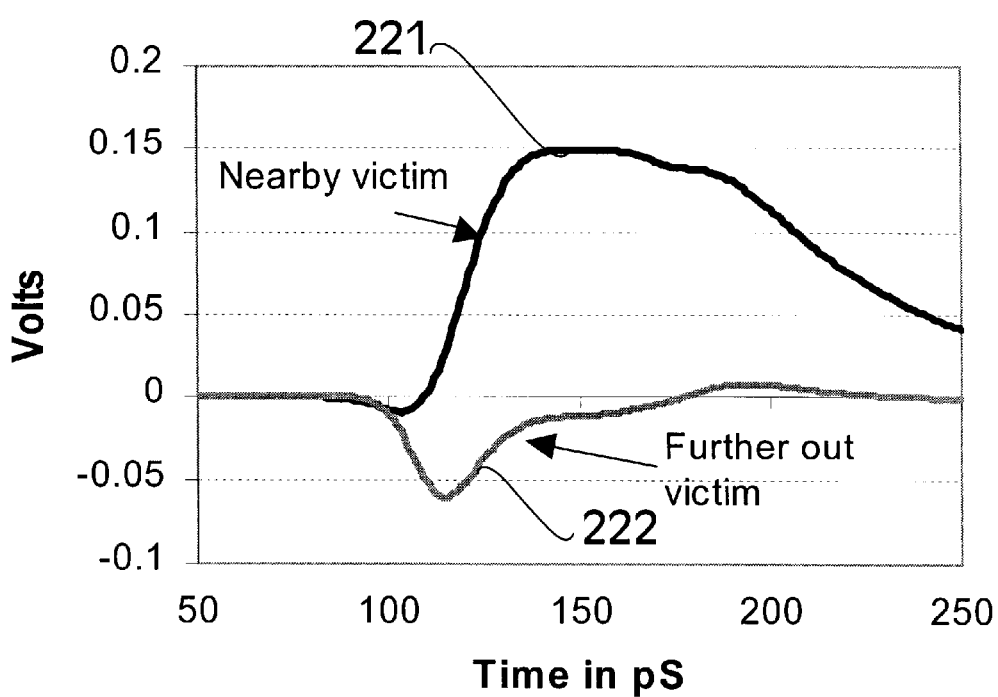
FIG. 2b illustrates a positive noise voltage due to a capacitive coupling between the attacker signal line and a nearby victim signal line, and a negative noise voltage due to an inductive coupling between the attacker signal line and another victim signal line further away.

FIG. 2a illustrates a rising voltage 211 over time corresponding to a switching voltage state of an attacker signal line. FIG. 2b illustrates a positive noise voltage 221 due to a capacitive coupling between the attacker signal line and a nearby victim signal line, and a negative noise voltage 222 due to an inductive coupling between the attacker signal line and another victim signal line further away from the attacker. A key observation is that by reversing the positions of the near victim signal line and far victim signal line with respect to the attacker in a subsequent interconnect segment, a partial cancellation of the capacitive and inductive noise voltages may be provided. Therefore, it will be appreciated that a partial cancellation of capacitive and inductive noise may be provided in a subsequent interconnect segment by a swizzling of a set of signal lines.

It will be appreciated that not every swizzling of a set of signal lines is equally effective. It is desirable to transpose the order of capacitive and inductive victims or attackers so that when a signal is adjacent to a first subset of signal lines before the swizzling and adjacent to a second subset of signal lines after the swizzling, the first subset and the second subset are disjoint (include no signal lines in common).

Figure 3:
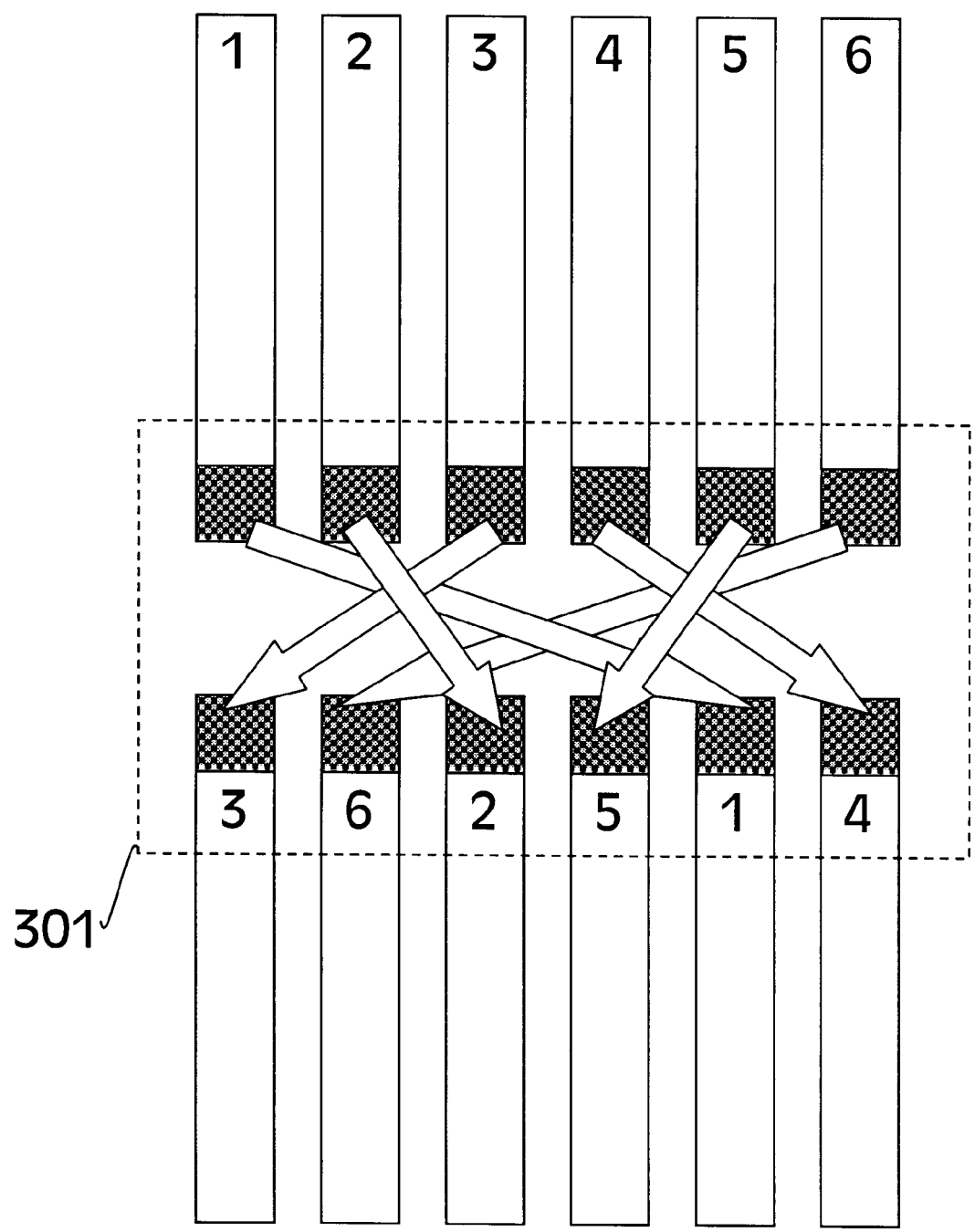
FIG. 3 illustrates one embodiment of a swizzling for a set of six signal lines.

FIG. 3 illustrates one embodiment of a swizzling 301 for a set of six signal lines having an initial order {1,2,3,4,5,6}. Swizzling 301 reorders the set placing signal line 3 next to signal line 6 for capacitive and inductive noise cancellation. Similarly signal line 6 is placed next to signal lines 3 and 2, signal line 2 is placed next to signal lines 6 and 5, signal line 5 is placed next to signal lines 2 and 1, signal line 1 is placed next to signal lines 5 and 4, and signal line 4 is placed next to signal line 1 to provide a stage of capacitive and inductive noise cancellation for the set.

Typically the inductive noise from one attacker is weaker than the capacitive noise form one attacker. A key observation is that additional swizzling may be used to provide subsequent stages of further capacitive and inductive noise cancellation for the set by balancing the number of signal lines that are near neighbors in subsequent stages. It will also be appreciated that swizzling 301 additionally provides for signal lines 3 and 4 to be half-shielded during the stage of capacitive and inductive noise cancellation.

For the purpose of this discussion, a reordered set of signal lines given, for example, by {3,1,5,2,6,4} may be used herein to represent a swizzle or swizzling with respect to an initial set {1,2,3,4,5,6} and may be equivalently expressed as a corresponding non-unique product of transpositions, (1,3)(2,3)(3,4)(3,5)(5,6). The new signal line positions for a first swizzle stage may be computed as follows:

$$(1,3)(2,3)(3,4)(3,5)(5,6)\{1,2,3,4,5,6\} = (1,3)(2,3)(3,4)(3,5)\{1,2,3,4,6,5\}$$
$$= (1,3)(2,3)(3,4)\{1,2,5,4,6,3\}$$
$$= (1,3)(2,3)\{1,2,5,3,6,4\}$$
$$= (1,3)\{1,3,5,2,6,4\}$$
$$= \{3,1,5,2,6,4\}.$$

A composition of two swizzles may be expressed as a product of their corresponding transpositions and applied to an ordered set. For example, the product of {3,1,5,2,6,4} with itself may be computed as:

$$[(1,3)(2,3)(3,4)(3,5)(5,6)][(1,3)(2,3)(3,4)(3,5)(5,6)]\{1,2,3,4,5,6\} =$$
$$(1,3)(2,3)(3,4)(3,5)(5,6)\{3,1,5,2,6,4\} = (1,3)(2,3)(3,4)(3,5)\{3,1,6,2,5,4\}$$
$$= (1,3)(2,3)(3,4)\{5,1,6,2,3,4\}$$
$$= (1,3)(2,3)\{5,1,6,2,4,3\}$$
$$= (1,3)\{5,1,6,3,4,2\}$$
$$= \{5,3,6,1,4,2\}.$$

Hence, the signal line positions for subsequent swizzle stages of a multiple-stage swizzling pattern may be computed by compositions of sequential swizzles.

In selecting a multiple-stage swizzling pattern, it is desirable to provide new neighboring signal lines in consecutive swizzle stages for as many of the set as may be convenient. One reasonable question to ask is, "How many swizzle stages, s, does it take to provide a balanced distribution of signal line adjacencies for an ordered set of n signal lines?" In a typical interconnect, if for any one signal line, the maximum number of adjacent signal lines is two, then the number of stages to place each signal line adjacent to each of the other signal lines of the set may be computed by solving the following quadratic equation:

$$n^2/2-(2s+3)n/2+s+1=0.$$

For example, when n=6, then s=2, so since any signal line is initially adjacent to one or two other signal lines, two additional stages are required to place every signal line adjacent to each of the five other signal lines of the set. For n=8, s=3, so three additional stages are required to place every signal line adjacent to each of the seven other signal lines of the set. Notably, however, since capacitive and inductive noise cancellation may be incrementally applied, some cancellation benefits may be obtained by fewer stages than indicated by this equation. As will described below, for example with reference to FIGS. 11*a–c*, some benefit may also be obtained by more stages than indicated by this equation.

Figure 4A:
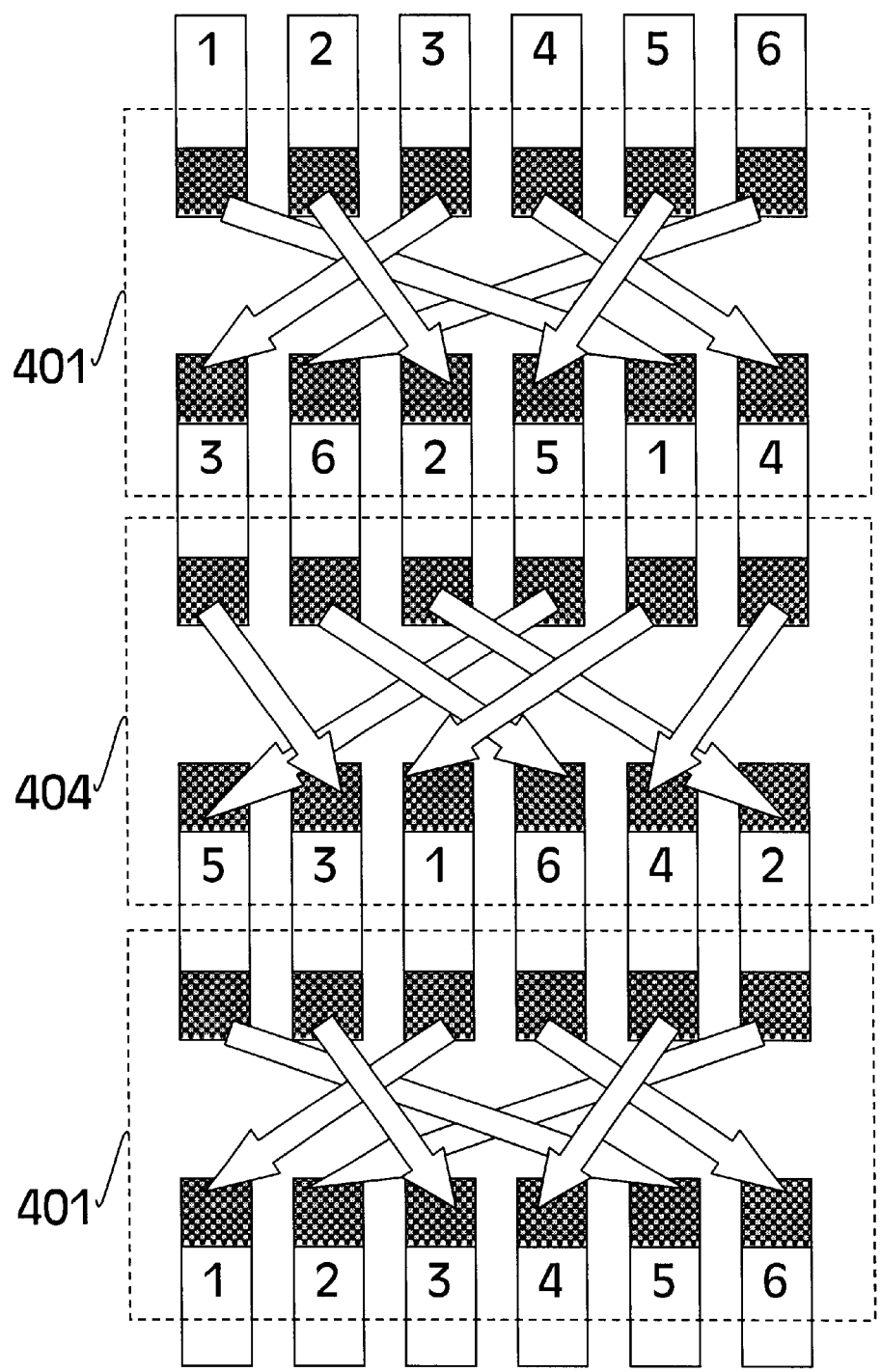
FIG. 4a illustrates one embodiment of a multiple-stage swizzling pattern for capacitive and inductive noise cancellation on a set of six signal lines.

FIG. 4*a* illustrates one embodiment of a multiple-stage swizzling pattern including swizzling 401 and swizzling 404 for capacitive and inductive noise cancellation on a set of six signal lines having an initial order {1,2,3,4,5,6}. Swizzling 401 reorders the set placing signal line 3 next to signal line 6, signal line 6 next to signal lines 3 and 2, signal line 2 next to signal lines 6 and 5, signal line 5 next to signal lines 2 and 1, signal line 2 next to signal lines 5 and 4, and signal line 4 next to signal line 1 to provide a first stage of capacitive and inductive noise cancellation for the set. Swizzling 404 reorders the set placing signal line 5 next to signal line 3, signal line 3 next to signal lines 5 and 1, signal line 1 next to signal lines 3 and 6, signal line 6 next to signal lines 1 and 4, signal line 4 next to signal lines 6 and 2, and signal line 2 next to signal line 4 to provide a second stage of further capacitive and inductive noise cancellation for the set. Finally, an optional application of swizzling 401 reorders the set of signal lines to restore the initial order of the set.

Figure 4B:
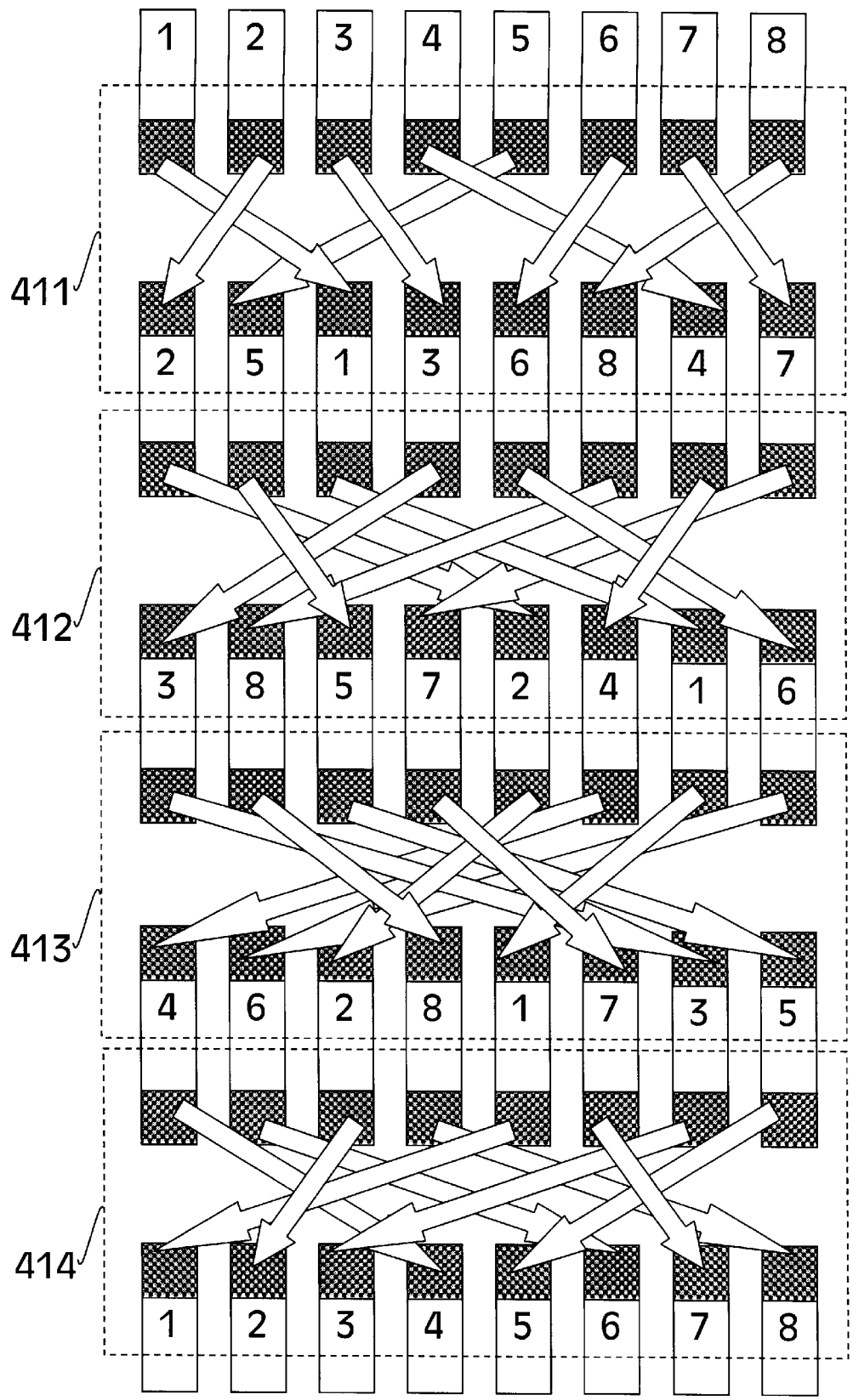
FIG. 4b illustrates one embodiment of a multiple-stage swizzling pattern for capacitive and inductive noise cancellation on a set of eight signal lines.

FIG. 4*b* illustrates one embodiment of a multiple-stage swizzling pattern including swizzling 411, swizzling 412, and swizzling 413 for capacitive and inductive noise cancellation on a set of eight signal lines having an initial order {1,2,3,4,5,6,7,8}. Swizzling 411 reorders the set placing signal line 2 next to signal line 5, signal line 5 next to signal lines 2 and 1, signal line 1 next to signal lines 5 and 3, signal line 3 next to signal lines 1 and 6, signal line 6 next to signal lines 5 and 8, signal line 8 next to signal lines 6 and 4, signal line 4 next to signal lines 8 and 7, and signal line 7 next to signal line 4 to provide a first stage of capacitive and inductive noise cancellation for the set. Swizzling 412 reorders the set placing signal line 3 next to signal line 8, signal line 8 next to signal lines 3 and 5, signal line 5 next to signal lines 8 and 7, signal line 7 next to signal lines 5 and 2, signal line 2 next to signal lines 7 and 4, signal line 4 next to signal lines 2 and 1, signal line 1 next to signal lines 4 and 6, and signal line 6 next to signal line 1 to provide a second stage of further capacitive and inductive noise cancellation for the set. Swizzling 413 reorders the set placing signal line 4 next to signal line 6, signal line 6 next to signal lines 4 and 2, signal line 2 next to signal lines 6 and 8, signal line 8 next to signal lines 2 and 1, signal line 1 next to signal lines 8 and 7, signal line 7 next to signal lines 1 and 3, signal line 3 next to signal lines 7 and 5, and signal line 5 next to signal line 3 to provide a third stage of further capacitive and inductive noise cancellation for the set. Finally, an optional application of swizzling 414 reorders the set of signal lines to restore the initial order of the set.

The multiple-stage swizzling patterns of the two examples of FIGS. 4*a* and 4*b* provide, for every signal line, a placement adjacent to every other signal line of the set exactly once. These multiple-stage swizzling patterns additionally provide for every signal line of the set to be half-shielded during some stage of capacitive and inductive noise cancellation. Both of these are desirable features for one embodiment of a multiple-stage swizzling pattern. By properly constructing a multiple-stage swizzling pattern, one or more of these desirable features may be accorded, thereby providing for effective capacitive and inductive noise cancellation.

Figure 5:
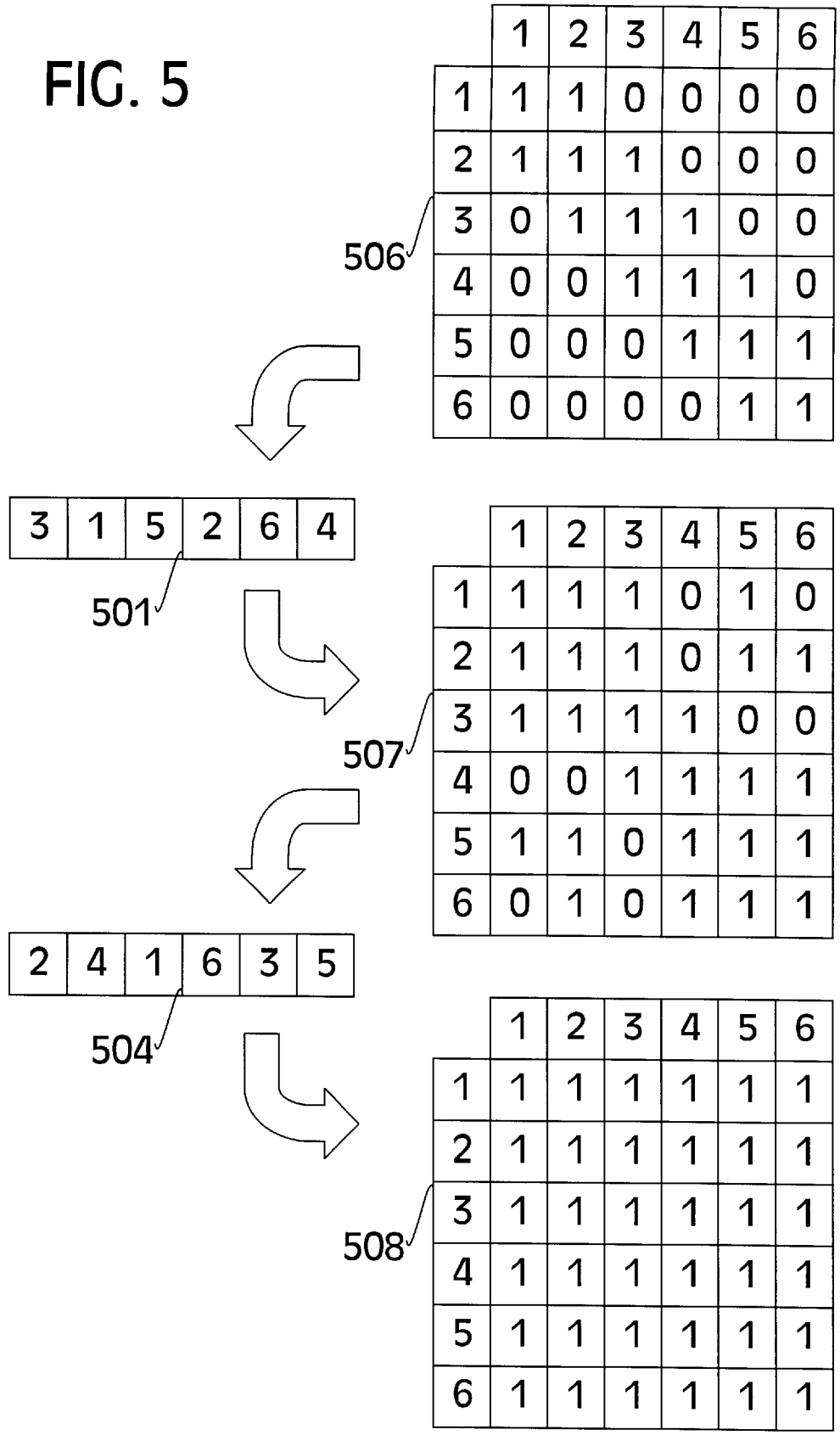
FIG. 5 illustrates one embodiment of a method for calculating a multiple-stage swizzling pattern for capacitive and inductive noise cancellation on a set of six signal lines.

FIG. 5 illustrates one embodiment of a method for calculating a multiple-stage swizzling pattern for capacitive and inductive noise cancellation on a set of six signal lines. Each of the rows and columns of matrix 506 are labeled for a particular signal line 1–6. Matrix 506 is initialized along its diagonal with a capacitive and inductive noise cancellation target value of 1. As will be illustrated in this and in succeeding examples, the target value may be used to provide that each signal line will be placed adjacent to every other signal line of the set exactly once. The rest of the entries of matrix 506 are initialized by counting the number of times a signal line is adjacent to another signal line in the initial order {1,2,3,4,5,6} of the set. For example, signal line 1 is adjacent to signal line 2 and so a 1 in entered at row 1 column 2; signal line 2 is adjacent to signal line 1 so a 1 is entered at row 2, column 1; signal line 1 is not adjacent to signal line 3 so a 0 is entered as row 1, column 3; and so forth for the rest of the entries of matrix 506.

A capacitive and inductive noise cancellation metric, m, may be set forth. For example, one possible metric in the case of the method illustrated in FIG. 5 may be expressed as a function that sums a cancellation potential for each row of matrix 506 and subtracts the sum from a cancellation target, e.g.:

$$m = 20 - \Sigma_{for\ 1 \leq i,j \leq 6} |\text{entry}(i,i) - \text{entry}(i,j)|.$$

Therefore m=0 for matrix 506. A swizzle stage 501 is then computed to increase the capacitive and inductive noise cancellation metric, m. Metric m may be increased by at most 10 in a particular swizzle stage, for instance if swizzle stage 501 places every signal line adjacent to signal lines other than the signal lines they are adjacent to in the initial order {1,2,3,4,5,6}. Since in swizzle stage 501, the order {3,1,5,2,6,4} places 1 next to 3 and 5, 2 next to 5 and 6, 3 next to 1, 4 next to 6, 5 next to 1 and 2,and 6 next to 2 and 4. (none of which were adjacent in the initial order) the corresponding entries in matrix 507 are changed from 0 to 1, resulting in an increased capacitive and inductive noise cancellation metric of m=10.

Swizzle stage 501 may be computed to increase the capacitive and inductive noise cancellation metric, m, in any one of a number of ways. For one embodiment and exhaustive search may be made, for example, of all possible signal line orders. For an alternative embodiment, two signal line numbers may be transposed from the current order placing at least one of the two lines next to a signal line that would increase the capacitive and inductive noise cancellation metric. For example, a transposition (5,6) creates an order {1,2,3,4,6,5} placing 6 next to 4, which provides for changing two of the entries of 0 in matrix 506 and increasing m to a value of 2.

Of course signal lines may be exchanged in cycles of various other lengths in addition to or instead of transpositions (cycles of length 2) but for simplification of the present discussion, transpositions are described since a cycle of any length may be expressed as a product of transpositions. Since, in this case, m may be increased by up to a limit of 10 in one swizzle stage, new transpositions may be selected until the swizzle stage cancellation limit is reached.

For example, another transposition (1,2) creates an order {2,1,3,4,6,5} placing 1 next to 3, and increasing m to a value of 4; a third transposition (3,5) creates an order {2,1,5,4,6,3} placing 3 next to 6, placing 5 next to 1, and increasing m to a value of 6; a fourth transposition (3,4) creates an order {2,1,5,3,6,4} placing 3 next to both 6 and 5, and increasing m to a value of 8; and finally a transposition (2,3) creates an order {3,1,5,2,6,4} placing 3 next to 1 and replacing 3 with 2 next to both 5 and 6 thereby increasing m to the limit value of 10. It will be appreciated that by starting with transpositions that involve signal lines on the leftmost and rightmost ends, half-shielding is provided for other signal lines of the set and successful completion of the swizzling pattern may be provided a higher probability.

Similarly, swizzle stage 504 may be computed to increase the capacitive and inductive noise cancellation metric, m. Since in swizzle stage 504, the order {2,4,1,6,3,5} places 1 next to 4 and 6, 2 next to 4, 3 next to 5 and 6, 4 next to 1 and next to 3, and 6 next to 1 and 3 (none of which were adjacent in the initial order or in previously computed swizzle stage 501) the corresponding entries in matrix 508 are changed from 0 to 1, resulting a capacitive and inductive noise cancellation metric of m=20. Since no further increase in the capacitive and inductive noise cancellation metric is available, the swizzling pattern is complete except for an optional final swizzling to restore the set's original order.

A swizzling pattern, as herein disclosed, may be employed for a set of signal lines of an interconnect to provide multiple stages of capacitive and inductive noise cancellation for the signal line elements of the set. By employing such swizzling patterns in accordance with the teachings of the current disclosure, subsequent swizzle stages may be used to provide incremental improvements in noise reduction through capacitive and inductive noise cancellation among signal line elements of the set.

Figure 6A:
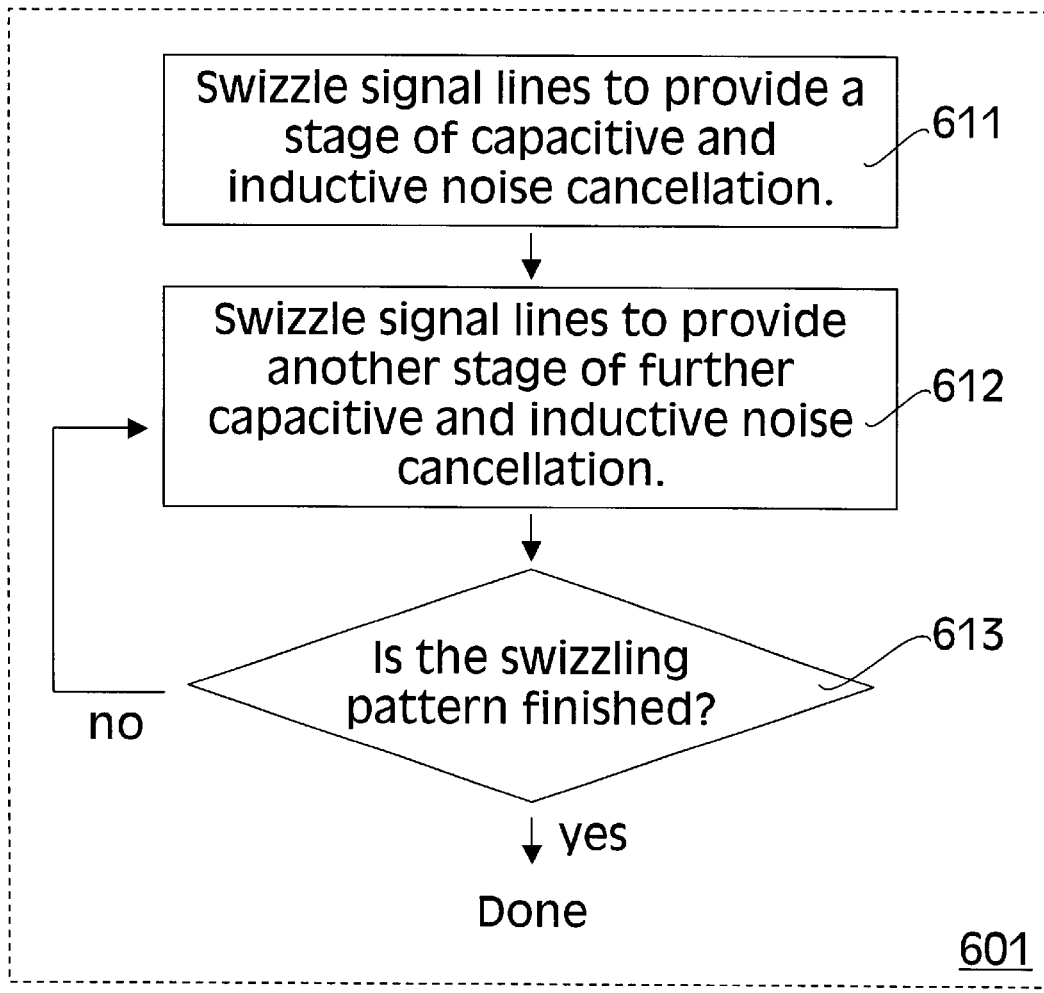
FIG. 6a illustrates a flow diagram for one embodiment of a process to employ swizzling for capacitive and inductive noise cancellation on a set of signal lines.

FIG. 6a illustrates a flow diagram for one embodiment of a process 601 to employ swizzling for capacitive and inductive noise cancellation on a set of signal lines. Process 601 and other processes herein disclosed are performed by processing blocks that may comprise dedicated hardware or software or firmware operation codes executable by general purpose machines or by special purpose machines or by a combination of both.

In processing block 611 a set of signal lines, having an initial order, is swizzled to provide a first stage of capacitive and inductive noise cancellation. Processing continues in processing block 612 where the set of signal lines, is swizzled again to provide another stage of further capacitive and inductive noise cancellation. In processing block 613 a check is performed to see if the swizzling pattern is finished. Such a check may be based upon a computed number of stages as disclosed above, or as will be discussed in greater detail in the succeeding examples, on a noise cancellation target or on one of a variety of other algorithmic techniques. If the swizzling pattern is not finished, processing continues in processing block 612 and the set of signal lines, is swizzled again to provide another stage of further capacitive and inductive noise cancellation. Otherwise, the process terminates from processing block 613.

It will be appreciated that the set of signal lines may or may not have been restored to their initial order following the completion of process 601. In such cases where the order of the set of signal lines after the completion of process 601 is not the same as the initial order of the set of signal lines, an additional swizzle stage may optionally be employed to restore the initial order of the set.

Figure 6B:
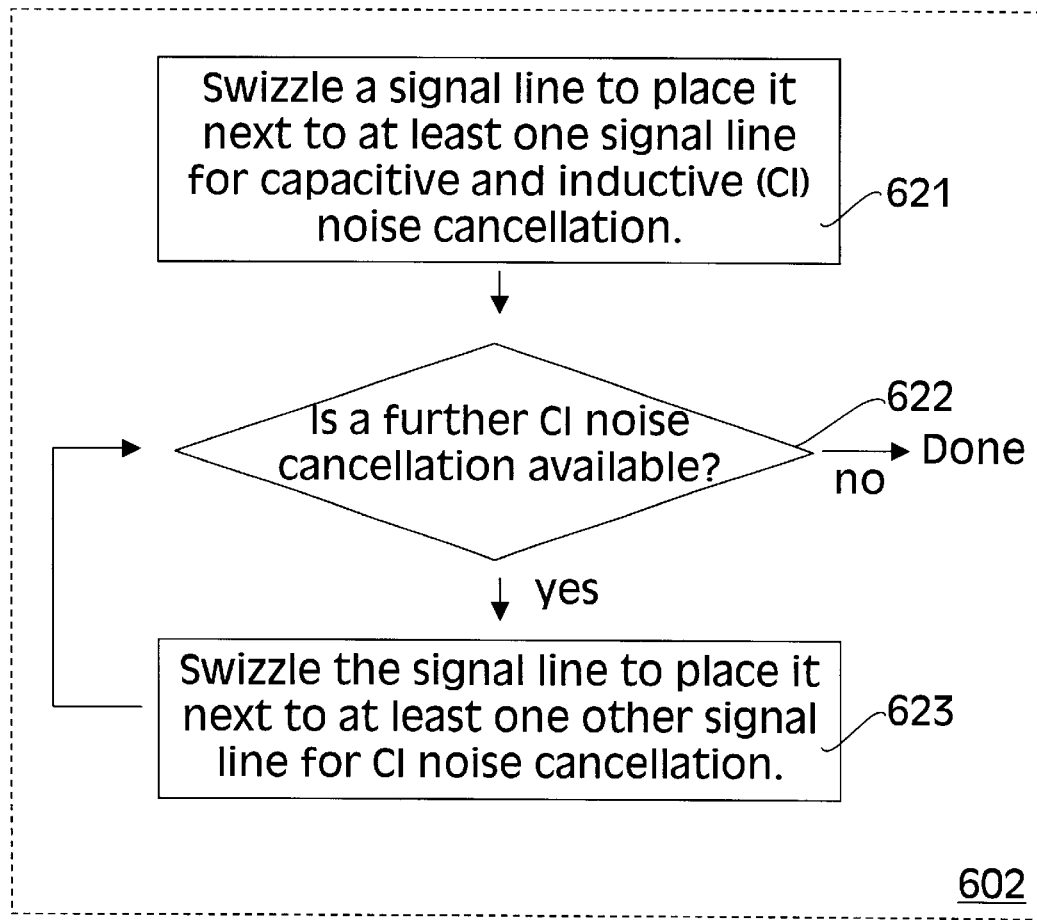
FIG. 6b illustrates a flow diagram for an alternative embodiment of a process to employ swizzling for capacitive and inductive noise cancellation on a set of signal lines.

FIG. 6b illustrates a flow diagram for an alternative embodiment of a process 602 to employ swizzling for capacitive and inductive noise cancellation on a set of signal lines. In processing block 621 a signal line of a set of signal lines is swizzled to place it next to at least one signal line for capacitive and inductive noise cancellation. Processing continues in processing block 622 where a check is performed to see if a further capacitive and inductive noise cancellation is available. If not, process 602 terminates from processing block 622. Otherwise, processing continues in processing block 623 and the signal line is swizzled again to place it next to at least one other signal line for capacitive and inductive noise cancellation. Processing then continues in processing block 622 where the check is again performed to see if a further capacitive and inductive noise cancellation is available.

It will be appreciated that process 602 may require multiple swizzle stages in order to place a particular signal line next to more than two other signal lines of the set for capacitive and inductive noise cancellation. It will also be appreciated that process 602 may be applied to any or all of the signal lines of the set of signal lines to provide capacitive and inductive noise cancellation for multiple signal line elements of the set, and again, in such cases where the order of the set of signal lines after one or more applications of process 602 is not the same as the initial order of the set of signal lines, an additional swizzle stage may optionally be employed to restore the initial order of the set.

Swizzling patterns may be employed for sets of signal lines in interconnects of various types, for example, in printed circuit boards, in flat cables, in on-chip busses, in ceramic substrates, etc. It will be appreciated that one typical set of signal lines of an interconnect may be constructed as metal traces in a layer of a very large-scale integrated (VLSI) circuit design. In such a construction, a swizzling pattern may be employed through the insertion or creation of a VLSI swizzle cell to reorder the signal lines for capacitive and inductive noise cancellation. If such a swizzle cell is repeatable it may more readily provide for automated insertion of swizzle cells and employment of swizzling patterns in the interconnect design.

For the purpose of this discussion, a repeatable swizzle cell or a repeatable swizzling of a set of signal lines is one that may be selected for use more than once in a particular swizzling pattern. For clarity of illustration, upper and lower layers of a VLSI design are distinguished from one another by reference in the present disclosure, but it will be appreciated that these distinctions may be conveniently chosen in accordance with a particular design.

Figure 7:
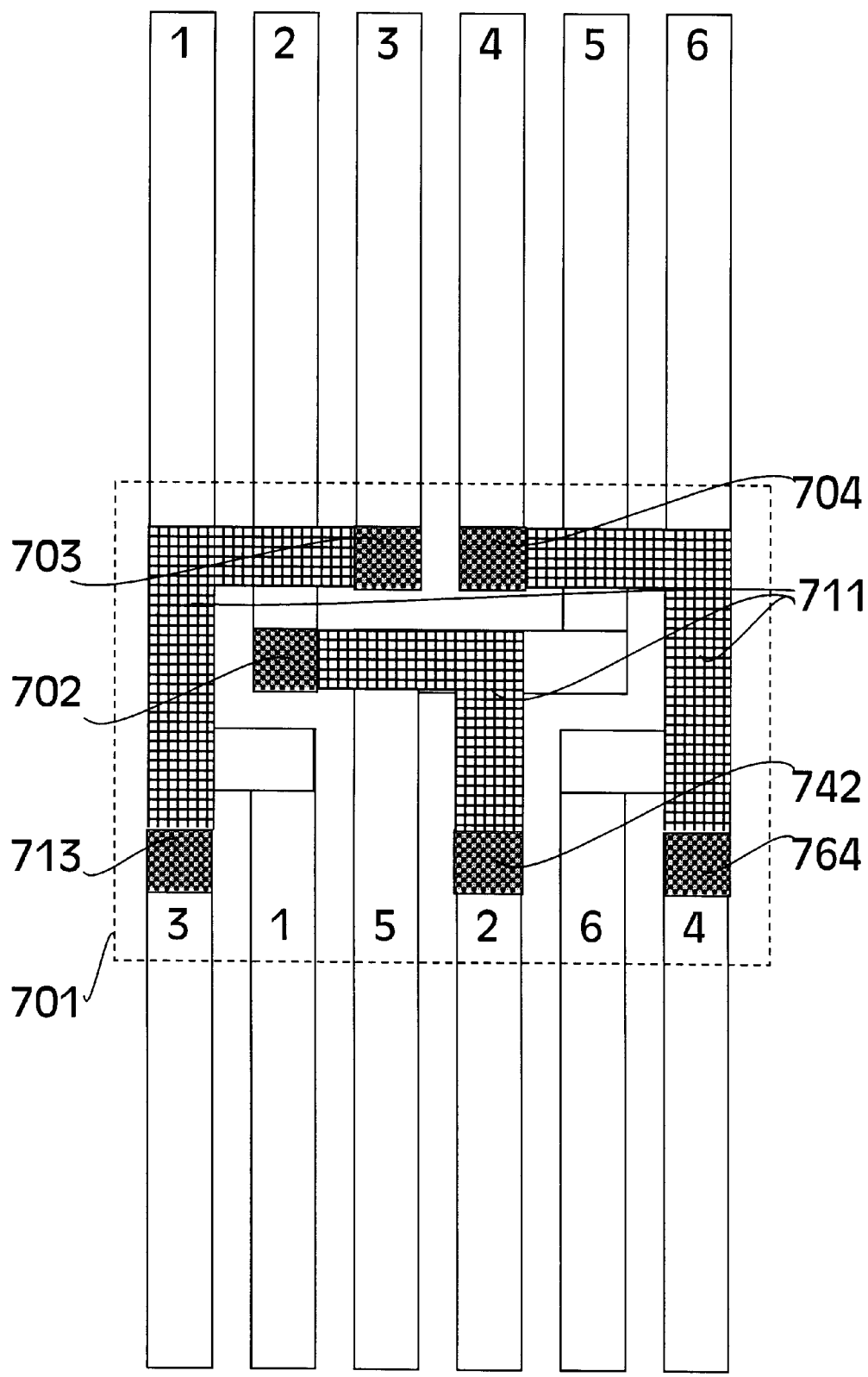
FIG. 7 illustrates one embodiment of a repeatable swizzle cell for capacitive and inductive noise cancellation on a set of six signal lines.

FIG. 7 illustrates one embodiment of a repeatable swizzle cell 701 to provide a swizzling according to a particular reassignment of signal tracks for capacitive and inductive noise cancellation on a set of six signal lines having an initial order $\{1,2,3,4,5,6\}$. For one embodiment, swizzle cell 701 comprises at least two layers of metal traces and vias to establish conductive connections between the layers. Since swizzle cell 701 may be efficiently designed once but reused many times, the repetition of use provides for cost and labor savings and the efficiency of design provides for area and complexity savings in the interconnect design. Signal line 1 is swizzled to place it next to signal lines 3 and 5 for capacitive and inductive noise cancellation by routing the metal on the lower layer from the leftmost signal track to the second signal track. On the other hand, signal line 2 is swizzled to place it next to signal lines 5 and 6 for capacitive and inductive noise cancellation by routing the metal on an upper layer from the second signal track to the fourth signal track and connecting to the lower layer through via 702 and via 742. Similarly, signal line 3 is swizzled to place it next to signal line 1 by routing the metal on an upper layer from the third signal track to the leftmost signal track and connecting to the lower layer through via 703 and via 713; signal line 4 is swizzled to place it next to signal lines 6 by routing the metal on an upper layer from the fourth signal track to the rightmost signal track and connecting to the lower layer through via 704 and via 764; signal line 5 is swizzled to place it next to signal lines 1 and 2 by routing the metal on the lower layer from the fifth signal track to the third signal track; and signal line 6 is swizzled to place it next to signal lines 2 and 4 by routing the metal on the lower layer from the rightmost signal track to the fifth signal track. It will be appreciated in accordance with the discussion below (for example, with reference to swizzle cell 1311 in FIG. 13a), that swizzle cell 701 and other repeatable swizzle cells may be inserted repeatedly into an interconnect to employ a swizzling pattern.

A swizzling pattern may be more efficiently constructed through the reuse of repeatable swizzle cells. Libraries comprising repeatable swizzle cells may be made available to computer aided design systems for automated insertion of swizzle cells, and for automated calculation and employment of swizzling patterns for capacitive and inductive noise cancellation. Alternatively, repeatable swizzle cells may be automatically calculated and optimally routed according to design specifications and parameters, then reused to construct multiple-stage swizzling patterns for capacitive and inductive noise cancellation.

As was discussed above, a composition of two swizzles may be expressed as a product of their corresponding transpositions and applied to an ordered set. If a composition of a swizzle with itself, after one or more times, produces another swizzle to increase capacitive and inductive noise cancellation, then that swizzle or successive compositions may be repeatedly used in constructing a swizzling pattern. For example, swizzling 301, expressed as $\{3,6,2,5,1,4\}$ may be referred to, for simplicity, as a, and swizzling 501, expressed as $(3,1,5,2,6,4)$ may be referred to, for simplicity, as b. It will then be appreciated that repeated compositions of a and b generate swizzle groups with respect to an initial order $\{1,2,3,4,5,6\}$ as follows:

$$a^1 = \{3,6,2,5,1,4\}, \quad b^1 = \{3,1,5,2,6,4\},$$

$$a^2 = \{2,4,6,1,3,5\}, \quad b^2 = \{5,3,6,1,4,2\},$$

$$a^3 = \{6,5,4,3,2,1\}, \quad b^3 = \{6,5,4,3,2,1\},$$

$$a^4 = \{4,1,5,2,6,3\}, \quad b^4 = \{4,6,2,5,1,3\},$$

$$a^5 = \{5,3,1,6,4,2\}, \quad b^5 = \{2,4,1,6,3,5\},$$

$$a^6 = \{1,2,3,4,5,6\}, \quad b^6 = \{1,2,3,4,5,6\}.$$

It will be further appreciated that a swizzling pattern given by $a^1,a^4,a^1$ may be employed as shown in FIG. 4a, since $a^1=\{3,6,2,5,1,4\}$, which results from swizzling 401; $a^1a^4=a^5=\{5,3,1,6,4,2\}$, which results from swizzling 404; and $a^1a^4a^1=a^6=\{1,2,3,4,5,6\}$, which results from the repeated use of swizzling 401. Similarly, a swizzling pattern given by $b^1,b^4,b^1$ may be employed as shown in FIG. 5, since $b^1=\{3,1,5,2,6,4\}$, which is computed as swizzle stage 501; $b^1b^4=b^5=\{2,4,1,6,3,5\}$, which is computed as swizzle stage 504; and $b^1b^4b^1=b^6=\{1,2,3,4,5,6\}$, indicating that b may be optionally employed to restore the initial order through a reuse of the swizzle cell of swizzle stage 501.

For the purpose of this discussion, swizzles such as a and b may be referred to as generators of their respective swizzle groups. Swizzle groups that may be generated by repeated compositions of a particular swizzle may also be referred to as cyclic swizzle groups. It will be appreciated that cyclic swizzle groups have the properties that exponents may be computed in a straight forward manner (modulo 6 in this case) and compositions are commutative, which is not true in general for composition of swizzles (which are associative). Such properties provide for efficient calculation of repeatable swizzling patterns. Accordingly, it will be appreciated that in addition to those presented above, numerous other combinations of elements from cyclic swizzle groups form repeatable swizzling patterns, for example: $a^4,a^4,a^4$; $a^1,a^1,a^4$; $a^2,a^2,a^2$; $a^5,a^2,a^5$; $a^5,a^5,a^2,a^2,a^5$, $a^5$ forth.

Figure 8A:
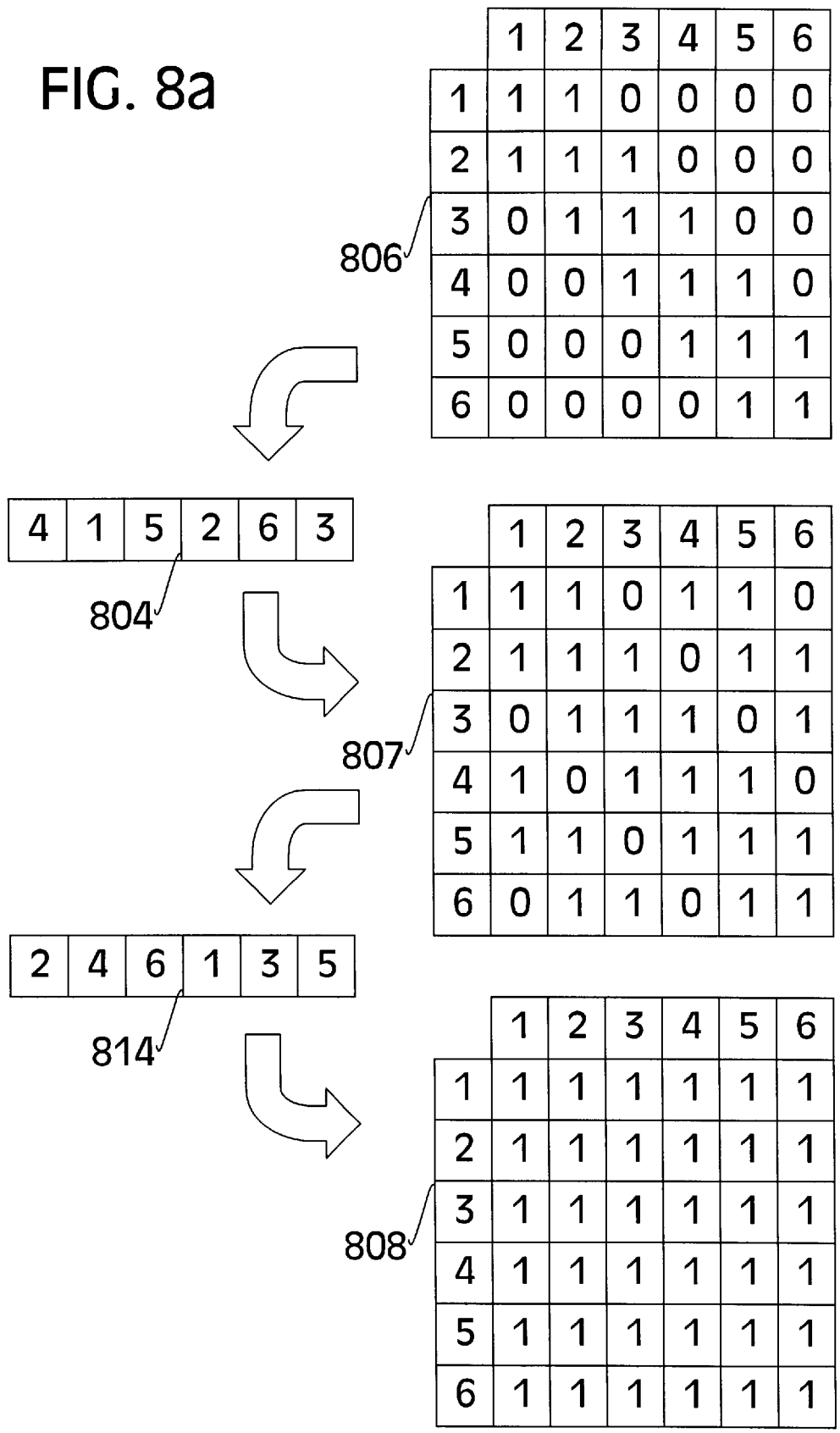
FIG. 8a illustrates one embodiment of a method for calculating a repeatable swizzling pattern for capacitive and inductive noise cancellation on a set of six signal lines.

FIG. 8a illustrates one embodiment of a method for calculating a repeatable swizzling pattern for capacitive and inductive noise cancellation on a set of six signal lines. Each of the rows and columns of matrix 806 are labeled for a particular signal line 1–6. Matrix 806 is initialized along its diagonal with a capacitive and inductive noise cancellation target value of 1 and the rest of the entries of matrix 806 are initialized according to the number of times a signal line is adjacent to another signal line in the initial order {1,2,3,4, 5,6} of the set.

A capacitive and inductive noise cancellation metric, m, may be set forth similar to the example illustrated in FIG. 5, i.e.:

$$m = 20 - \Sigma_{for\ 1 \leq i,j \leq 6} |\text{entry}(i,i) - \text{entry}(i,j)|.$$

A swizzle stage 804 is then computed to increase the capacitive and inductive noise cancellation metric, m. For example, m is increased by swizzle stage 804 placing every signal line adjacent to signal lines other than the signal lines they are adjacent to in the initial order {1,2,3,4,5,6}. Since in swizzle stage 804, the order {4,1,5,2,6,3} places 1 next to 4 and 5, 2 next to 5 and 6, 3 next to 6,4 next to 1, 5 next to 1 and 2, and 6 next to 2 and 3, none of which have entries of 1 in matrix 806, the corresponding entries in matrix 807 are changed from 0 to 1, resulting in a capacitive and inductive noise cancellation metric of m=10.

Next swizzle stage 804 is composed with itself to generate swizzle stage 814 and then checked to see if it increases the capacitive and inductive noise cancellation metric, m. Since in swizzle stage 814, the order {2,4,6,1,3,5} places 1 next to 3 and 6, 2 next to 4, 3 next to 1 and 5, 4 next to 2 and 6, 5 next to 3, and 6 next to 1 and 4, the corresponding entries in matrix 808 are changed from 0 to 1, resulting in a capacitive and inductive noise cancellation metric of m=20. Since no further increase in the capacitive and inductive noise cancellation metric is available, the swizzling pattern is complete. An optional swizzling to restore the set's original order may also be accomplished by composing swizzle stage 804 again with swizzle stage 814. It will be appreciated that the repeatable swizzling pattern calculated in FIG. 8a corresponds to the swizzling pattern $a^4$, $a^4$, $a^4$ mentioned above.

Figure 8B:
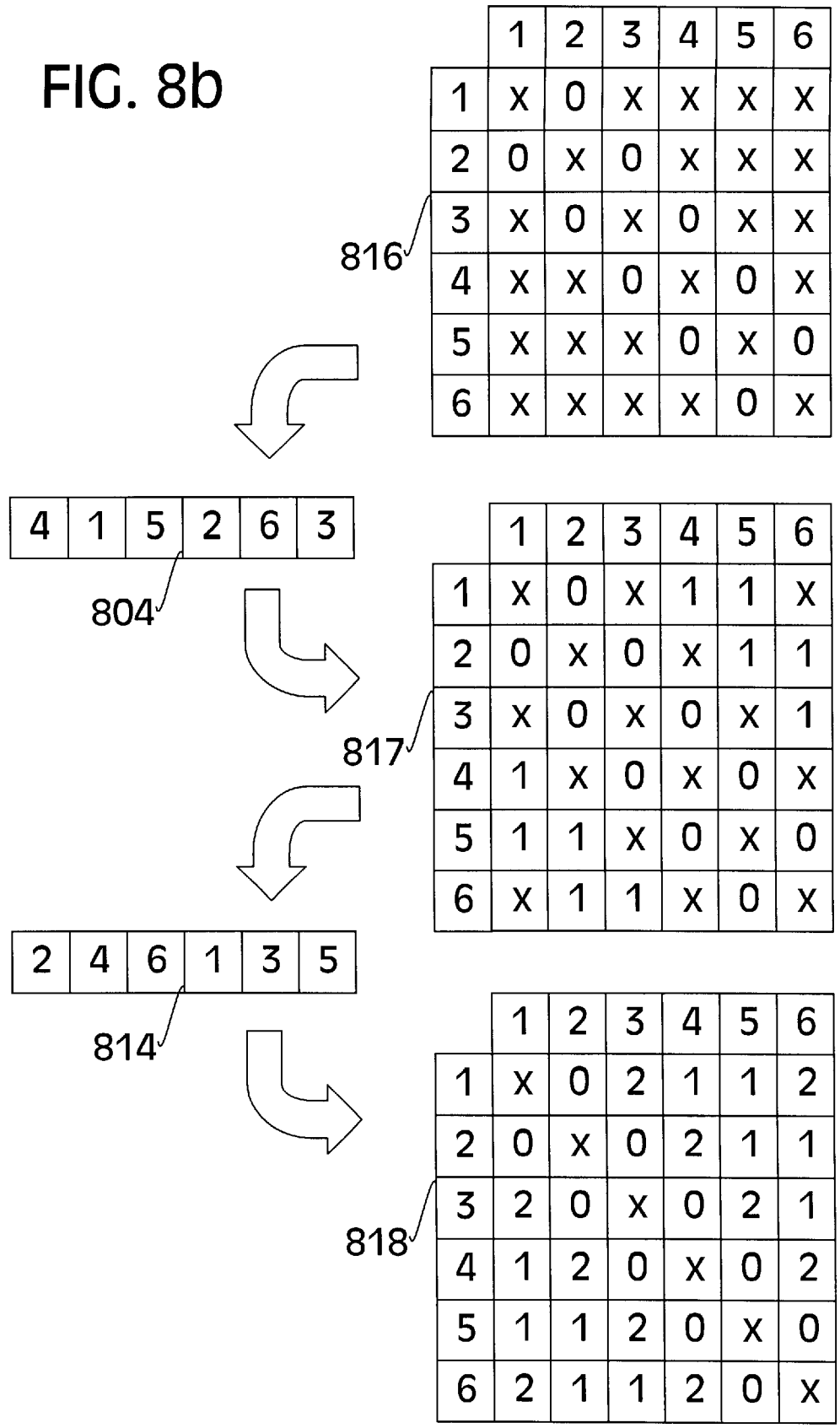
FIG. 8b illustrates an alternative embodiment of a method for calculating a swizzling pattern for capacitive and inductive noise cancellation on a set of six signal lines.

FIG. 8b illustrates an alternative embodiment of a method for calculating a swizzling pattern for capacitive and inductive noise cancellation on a set of six signal lines. Each of the rows and columns of matrix 816 are labeled for a particular signal line 1–6. Matrix 806 is initialized along its diagonal with x's and the rest of the entries of matrix 806 are initialized according to the stage in which a signal line is adjacent to another signal line. For example, the entries of matrix 816 receive a 0 if signal lines are adjacent in the initial order {1,2,3,4,5,6} of the set and an x if they are not.

An alternative capacitive and inductive noise cancellation metric, m, may be set forth as follows:

$$m = 26 - \Sigma_{for\ 1 \leq i,j \leq 6} [1\ \text{if entry}(i,j) = x;\ 0\ \text{otherwise}].$$

A swizzle stage 804 is then computed to increase the capacitive and inductive noise cancellation metric, m. For example, since in swizzle stage 804, the order {4,1,5,2,6,3} places 1 next to 4 and 5, 2 next to 5 and 6, 3 next to 6, 4 next to 1, 5 next to 1 and 2, and 6 next to 2 and 3, each of which have entries of x in matrix 816, the corresponding entries in matrix 817 are changed from x to 1, resulting in a capacitive and inductive noise cancellation metric of m=10.

Next swizzle stage 804 is composed with itself to generate swizzle stage 814 and then checked to see if it increases the capacitive and inductive noise cancellation metric, m. Since in swizzle stage 814, the order {2,4,6,1,3,5} places 1 next to 3 and 6, 2 next to 4, 3 next to 1 and 5, 4 next to 2 and 6, 5 next to 3, and 6 next to 1 and 4, the corresponding entries in matrix 818 are changed from x to 2, resulting in a capacitive and inductive noise cancellation metric of m=20. Since no further increase in the capacitive and inductive noise cancellation metric is available, the swizzling pattern is complete. An optional swizzling to restore the set's original order may also be performed as previously described.

Figure 8C:
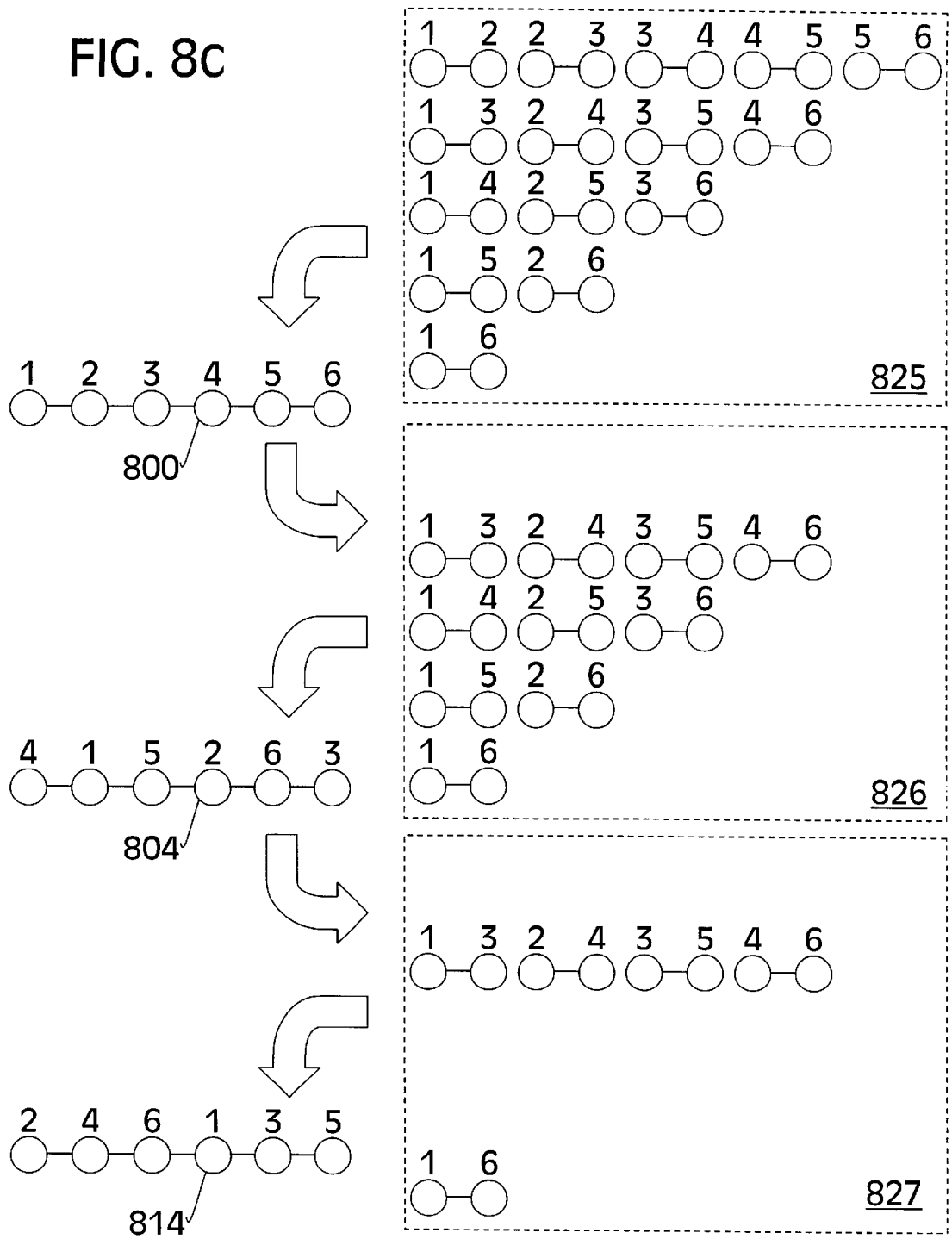
FIG. 8c illustrates another alternative embodiment of a method for calculating a swizzling pattern for capacitive and inductive noise cancellation on a set of six signal lines.

FIG. 8c illustrates another alternative embodiment of a method for calculating a swizzling pattern for capacitive and inductive noise cancellation on a set of six signal lines. Adjacency set 825 is initialized to contain all of the undirected edges of a completely connected graph with 6 vertices (corresponding to the 6 signal lines 1–6). Adjacency set 825 is updated for the initial order 800 of the set of signal lines by removing an edge(i,j) if a signal line i is adjacent to another signal line j in the initial order. The result is adjacency set 826.

An alternative capacitive and inductive noise cancellation metric, m, may be set forth as follows:

$$m = 10 - \Sigma_{for\ 1 \leq i,j \leq 6} [1\ \text{if edge}(i,j)\ \text{is in the adjacency set;}\ 0\ \text{otherwise}].$$

A swizzle stage 804 is then computed to increase the capacitive and inductive noise cancellation metric, m. For example, since a graph for swizzle stage 804 includes an edge(1,4), an edge(1,5), an edge(2,5), an edge(2,6), and an edge(3,6) these edges are removed in adjacency set 827, resulting in a capacitive and inductive noise cancellation metric of m=5.

Next swizzle stage 804 is composed with itself to generate swizzle stage 814 and then checked to see if a graph for swizzle stage 814 includes edges contained in adjacency set 827, which if removed, would increase the capacitive and inductive noise cancellation metric, m. Since a graph for swizzle stage 814 includes an edge(2,4), an edge(4,6), an edge(1,4), an edge(1,3), and an edge(3,5) these edges may be removed in adjacency set 827, resulting in a capacitive and inductive noise cancellation metric of m=10. Since no further increase in the capacitive and inductive noise cancellation metric is available, the swizzling pattern is complete. An optional swizzling to restore the set's original order may also be performed as previously described.

Figure 9A:
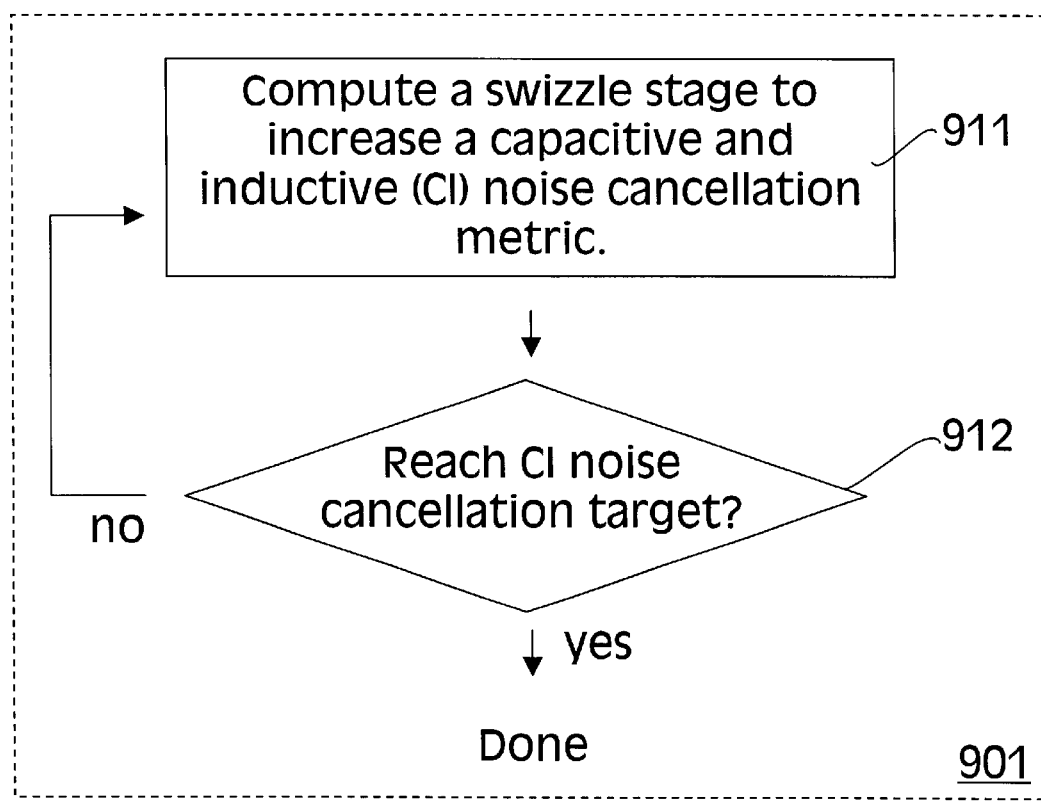
FIG. 9a illustrates a flow diagram for one embodiment of a process to calculate a swizzling pattern for capacitive and inductive noise cancellation.

FIG. 9a illustrates a flow diagram for one embodiment of a process 901 to calculate a swizzling pattern for capacitive and inductive noise cancellation. In processing block 911 a swizzle stage is computed to increase a capacitive and inductive (CI) noise cancellation metric. Processing continues in processing block 912 where a check is performed to see if the capacitive and inductive (CI) noise cancellation target has been reached. If so, process 901 terminates from processing block 912. Otherwise, processing continues in processing block 911 where another swizzle stage is computed to increase the capacitive and inductive (CI) noise cancellation metric. Processing then returns to processing block 912 until the capacitive and inductive (CI) noise cancellation target has been reached, which finally terminates process 901 from processing block 912.

It will be appreciated that in such cases where the order of the set of signal lines after one or more applications of process 901 is not the same as the initial order of the set of signal lines, an additional swizzle stage may optionally be computed to restore the initial order of the set.

Figure 9B:
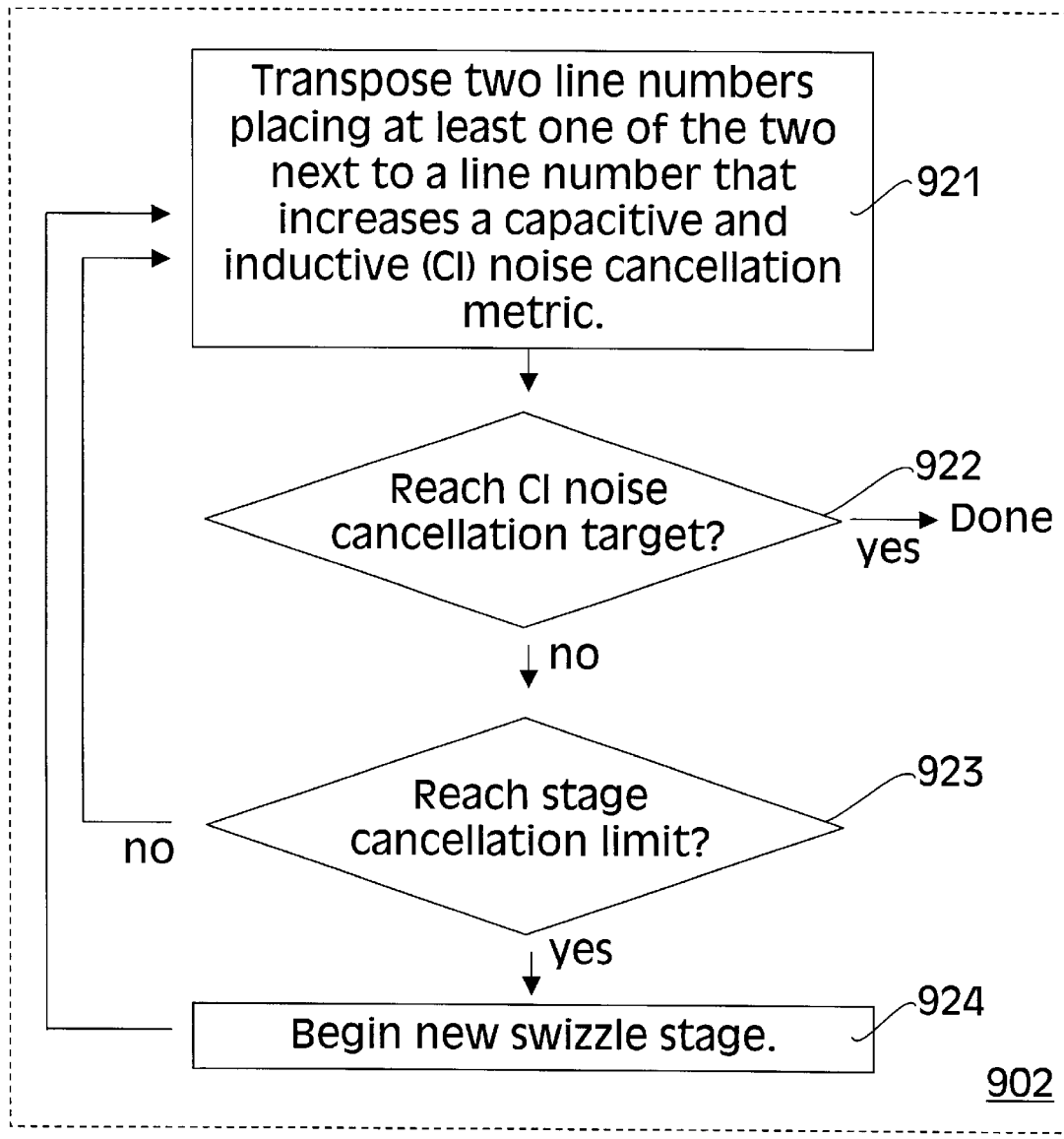
FIG. 9b illustrates a flow diagram for an alternative embodiment of a process to calculate a swizzling pattern for capacitive and inductive noise cancellation.

FIG. 9b illustrates a flow diagram for an alternative embodiment of a process 902 to calculate a swizzling pattern for capacitive and inductive noise cancellation. In processing block 921 two line numbers are transposed placing at least one of the two transposed line numbers next to a line number that increases a capacitive and inductive (CI) noise cancellation metric. Processing continues in processing block 922 where a check is performed to see if the capacitive and inductive (CI) noise cancellation target has been reached. If so, process 902 terminates from processing block 922. Otherwise, processing continues in processing block 923 a check is performed to see if the stage cancellation limit has been reached. If not, processing returns to processing block 921. Otherwise a new swizzle stage is begun in processing block 924 and then processing returns to processing block 921.

Figure 9C:
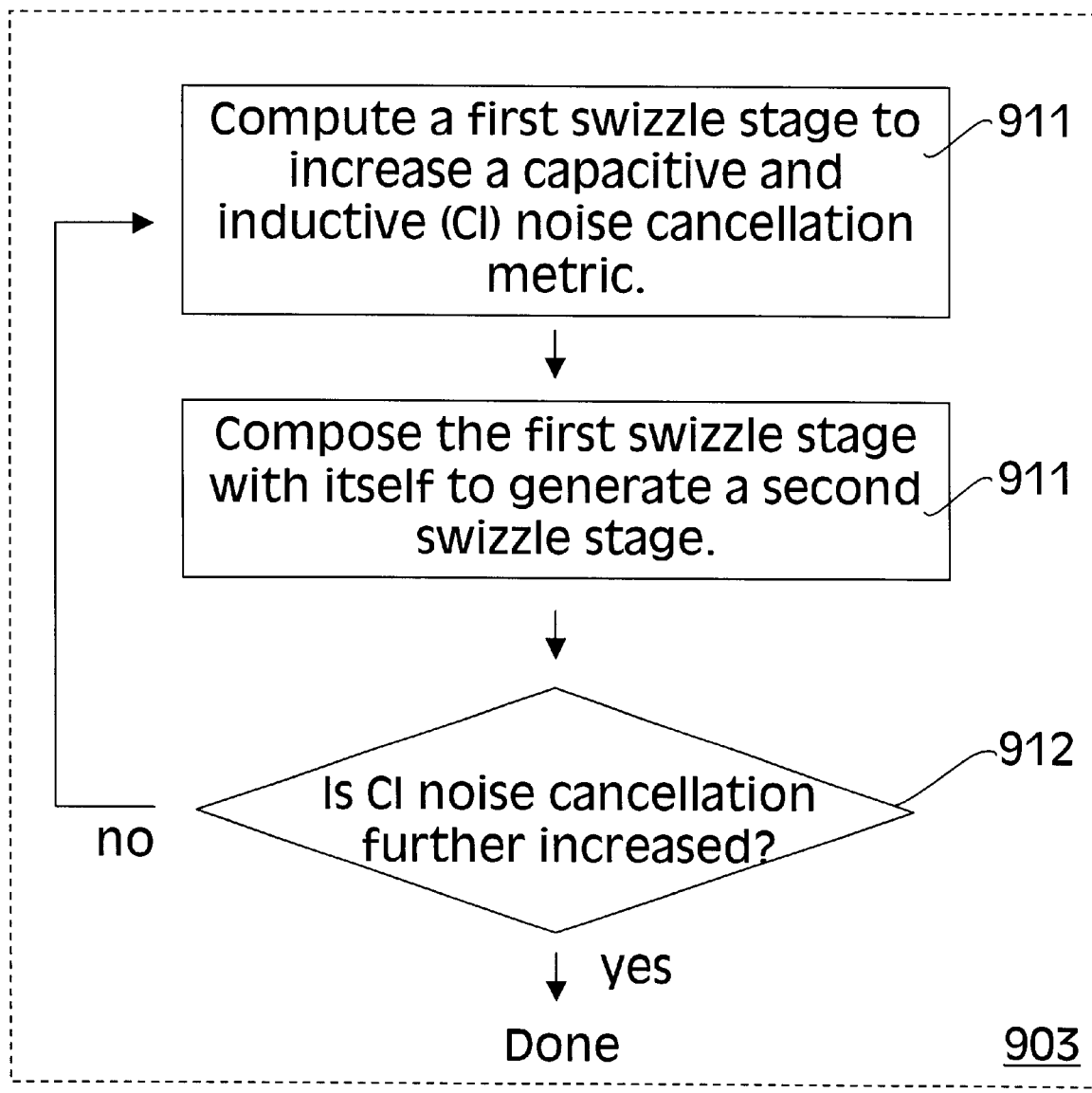
FIG. 9c illustrates a flow diagram for an alternative embodiment of a process to calculate a repeatable swizzling pattern for capacitive and inductive noise cancellation.

FIG. 9c illustrates a flow diagram for an alternative embodiment of a process 903 to calculate a repeatable swizzling pattern for capacitive and inductive noise cancellation. In processing block 911 a first swizzle stage is computed to increase a capacitive and inductive (CI) noise cancellation metric. Processing continues in processing block 931 where the first swizzle stage is composed with itself to generate a second swizzle stage. Processing then continues in processing block 932 where a check is performed to see if capacitive and inductive (CI) noise cancellation is further increased in the second swizzle stage. If so, process 903 terminates from processing block 932. Otherwise, processing continues in processing block 911 where a new first swizzle stage is computed to increase the capacitive and inductive (CI) noise cancellation metric, and then repeats processing block 931 and processing block 932 until a repeatable swizzling pattern is found, which finally terminates process 903 from processing block 932.

As was discussed above, when a swizzle composed with itself one or more times, produces another swizzle stage to increase capacitive and inductive noise cancellation, then that swizzle or successive compositions may be repeatedly used in constructing a swizzling pattern.

It will be appreciated that in cases where the order of the set of signal lines following one or more repetition of a repeatable swizzle is not the same as the initial order of the set of signal lines, an additional swizzle stage may optionally be used to restore the initial order of the set. Alternatively in cases where, starting after some primary swizzle stage, the order of the set of signal lines following one or more repetition of a repeatable swizzle is naturally restored to the initial order of the set of signal lines, then such a primary swizzle stage may be computed to facilitate the restoration of the initial order of the set.

Figure 10A:
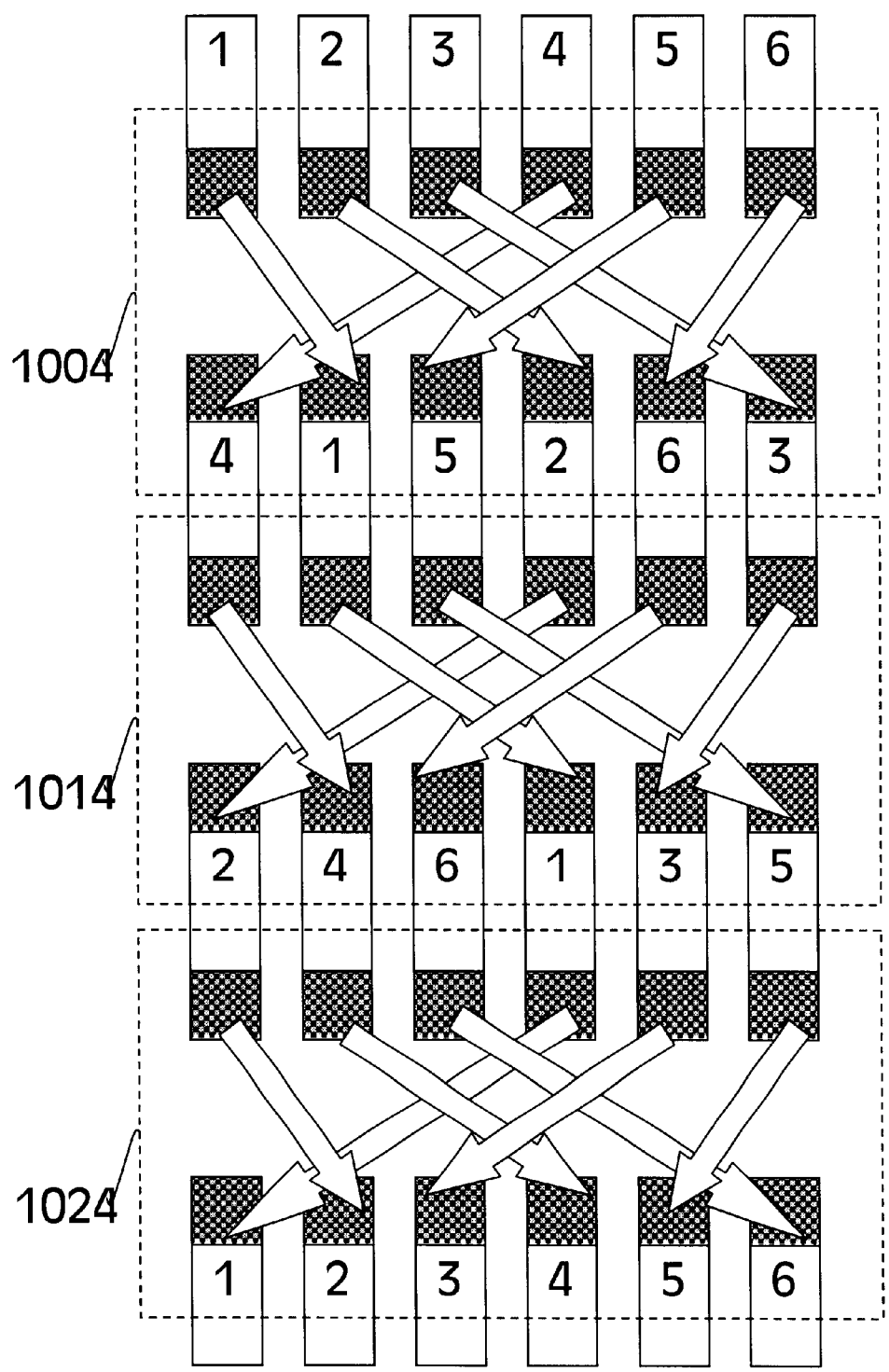
FIG. 10a illustrates one embodiment of a repeatable swizzling pattern for capacitive and inductive noise cancellation on a set of six signal lines.

FIG. 10a illustrates one embodiment of a repeatable swizzling pattern for capacitive and inductive noise cancellation on a set of six signal lines. In accordance with the previous discussion, a repeatable swizzling pattern given by $a^4, a^4, a^4$ may be employed as shown, since $a^4 = \{4,1,5,2,6,3\}$, which results from swizzling 1004; $a^4 a^4 = a^8 = a^2 = \{2,4,6,1,3,5\}$, which results from the repeated swizzling 1014; and $a^4 a^4 a^4 = a^{12} = a^0 = \{1,2,3,4,5,6\}$, which results from the repeated swizzling 1024.

Figure 10B:
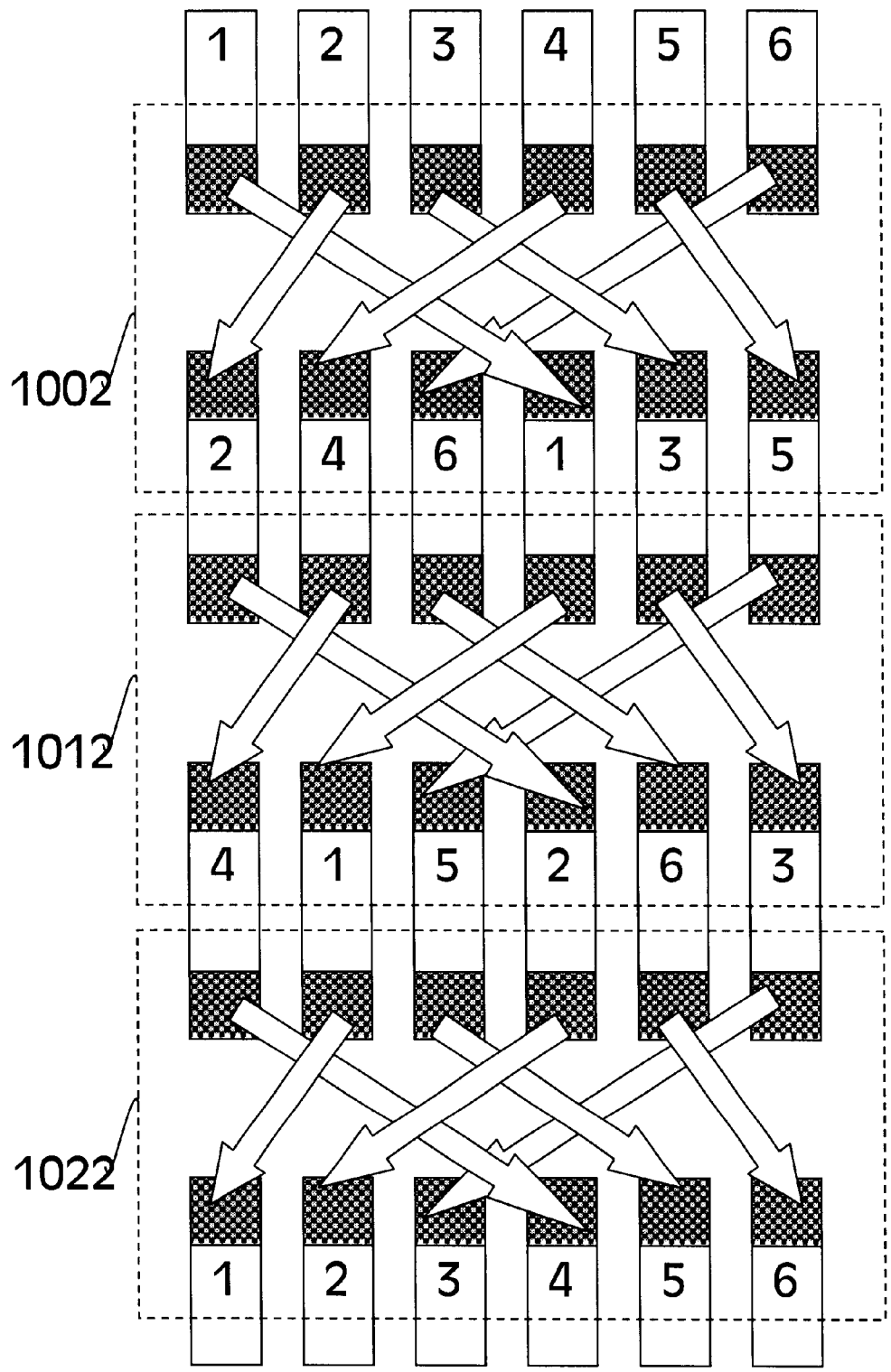
FIG. 10b illustrates an alternative embodiment of a repeatable swizzling pattern for capacitive and inductive noise cancellation on a set of six signal lines.

FIG. 10b illustrates an alternative embodiment of a repeatable swizzling pattern for capacitive and inductive noise cancellation on a set of six signal lines. A repeatable swizzling pattern given by $a^2, a^2, a^2$ may be employed as shown, since $a^2 = \{2,4,6,1,3,5\}$, which results from swizzling 1002; $a^2 a^2 = a^4 = \{4,1,5,2,6,3\}$, which results from the repeated swizzling 1012; and $a^2 a^2 a^2 = a^6 = a^0 = \{1,2,3,4,5,6\}$, which results from the repeated swizzling 1022.

Figure 10C:
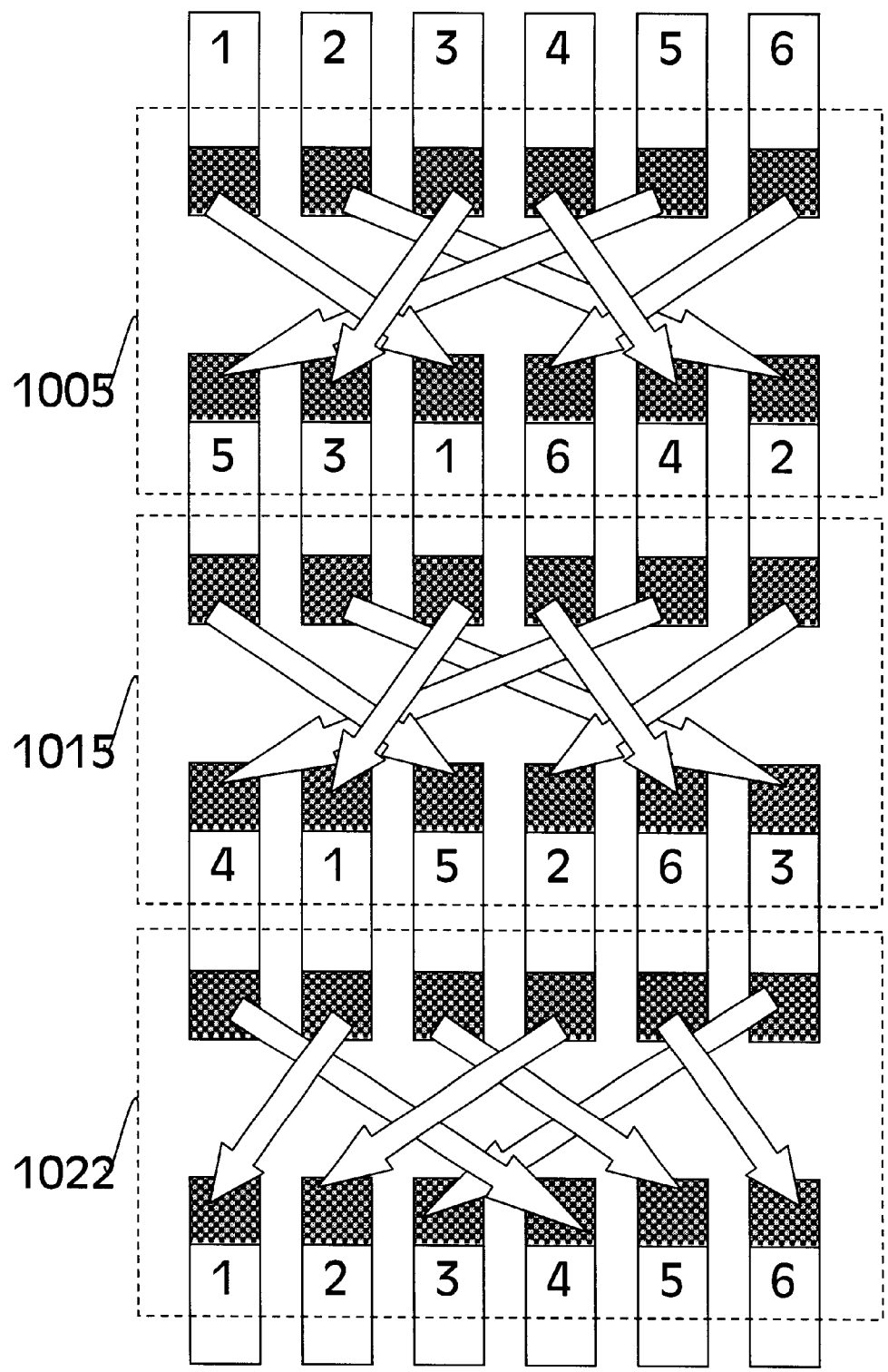
FIG. 10c illustrates another alternative embodiment of a repeatable swizzling pattern for capacitive and inductive noise cancellation on a set of six signal lines.

FIG. 10c illustrates another alternative embodiment of a repeatable swizzling pattern for capacitive and inductive noise cancellation on a set of six signal lines. A repeatable swizzling pattern given by $a^5, a^5, a^2$ may be employed as shown, since $a^5 = \{5,3,1,6,4,2\}$, which results from swizzling 1005; $a^5 a^5 = a^{10} = a^4 = \{4,1,5,2,6,3\}$, which results from the repeated swizzling 1015; and $a^5 a^5 a^2 = a^{12} = a^0 = \{1,2,3,4,5,6\}$, which results from swizzling 1022.

Figure 10D:
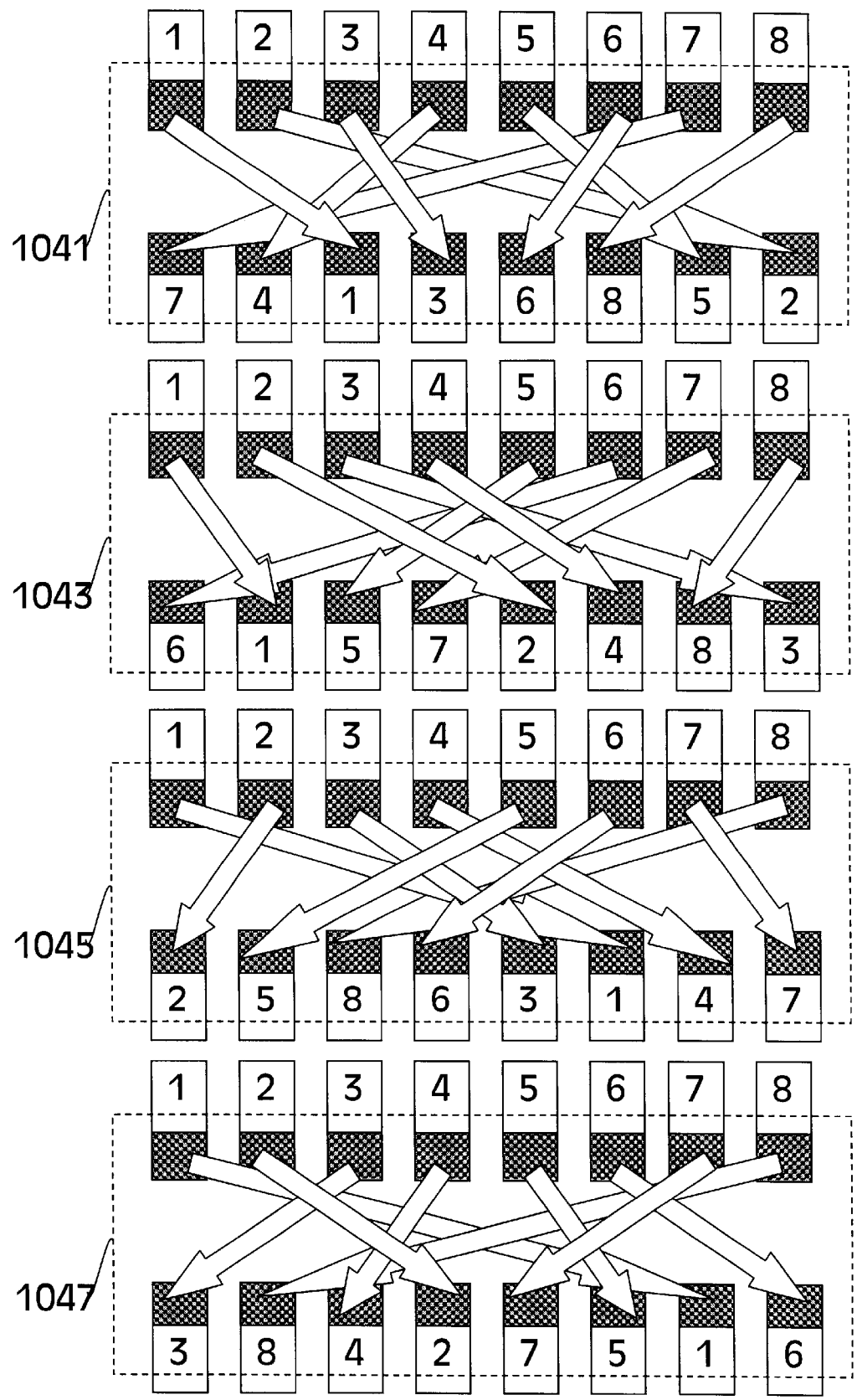
FIG. 10d illustrates one embodiment of repeatable swizzles for capacitive and inductive noise cancellation on a set of eight signal lines.
Figure 10E:
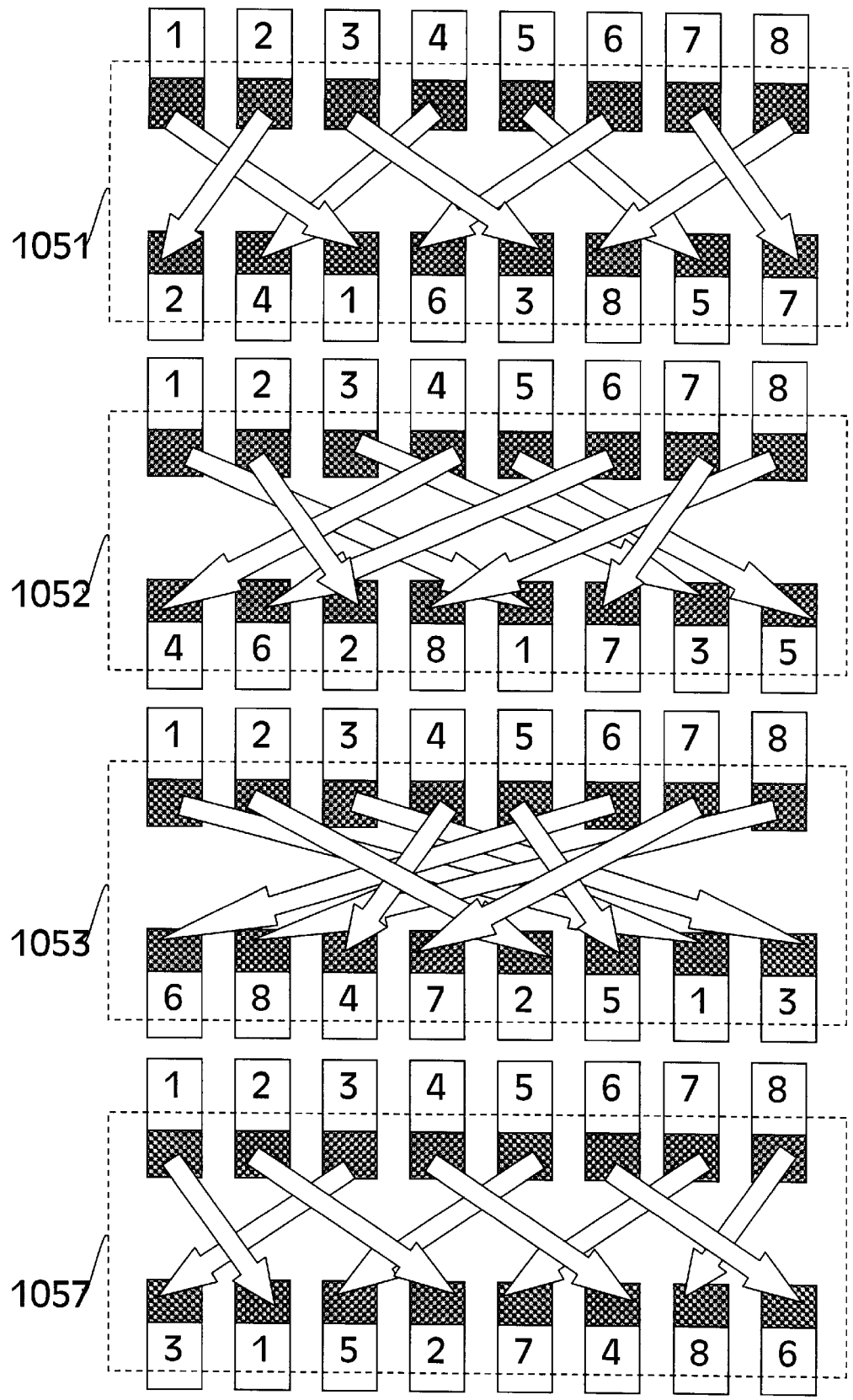
FIG. 10e illustrates an alternative embodiment of repeatable swizzles for capacitive and inductive noise cancellation on a set of eight signal lines.

It will be appreciated that a greater number of signal lines or a lesser number of signal lines may be included in a set in accordance with the signal to return ratio of the interconnect. Repeatable swizzling patterns may also be employed, in accordance with the current teachings, for sets having a greater number or a lesser number of signal lines. For example, FIG. 10d illustrates one embodiment of a useful subset of repeatable swizzles 1041, 1043, 1045 and 1047 for capacitive and inductive noise cancellation on a set of eight signal lines. Swizzling 1041, which may be expressed as $\{7,4,1,3,6,8,5,2\}$ may also be referred to, for simplicity of discussion, as c. FIG. 10e illustrates an alternative embodiment of a useful subset of repeatable swizzles 1051, 1052, 1053 and 1057 for capacitive and inductive noise cancellation on a set of eight signal lines. Swizzling 1051, which may be expressed as $\{2,4,1,6,3,8,5,7\}$ may be referred to as d.

It will be appreciated that repeated compositions of c and d generate swizzle groups with respect to an initial order $\{1,2,3,4,5,6,7,8\}$ as follows:

$$c^1 = \{7,4,1,3,6,8,5,2\}, \quad d^1 = \{2,4,1,6,3,8,5,7\},$$
$$c^2 = \{5,3,7,1,8,2,6,4\}, \quad d^2 = \{4,6,2,8,1,7,3,5\},$$
$$c^3 = \{6,1,5,7,2,4,8,3\}, \quad d^3 = \{6,8,4,7,2,5,1,3\},$$
$$c^4 = \{8,7,6,5,4,3,2,1\}, \quad d^4 = \{8,7,6,5,4,3,2,1\},$$
$$c^5 = \{2,5,8,6,3,1,4,7\}, \quad d^5 = \{7,5,8,3,6,1,4,2\},$$
$$c^6 = \{4,6,2,8,1,7,3,5\}, \quad d^6 = \{5,3,7,1,8,2,6,4\},$$
$$c^7 = \{3,8,4,2,7,5,1,6\}, \quad d^7 = \{3,1,5,2,7,4,8,6\},$$
$$c^8 = \{1,2,3,4,5,6,7,8\}, \quad d^8 = \{1,2,3,4,5,6,7,8\}.$$

It will be further appreciated that a swizzling pattern given by $c^1, c^1, c^1, c^5$, may be employed using swizzling 1041 repeatedly and optionally restoring the initial order of the set using swizzling 1045. A swizzling pattern given by $d^2, d^1, d^2, d^3$, may be employed using swizzling 1052 since $d^2 = \{4,6,2,8,1,7,3,5\}$; followed by swizzling 1051 since $d^2 d^1 = d^3 = \{6,8,4,7,2,5,1,3\}$; followed by a repeat of swizzling 1052 since $d^2 d^1 d^2 = d^5 = \{7,5,8,3,6,1,4,2\}$; and then optionally restoring the initial order of the set using swizzling 1053 since $d^2 d^1 d^2 d^3 = d^8 = \{1,2,3,4,5,6,7,8\}$. In one embodiment, it may be convenient to restore the initial order, in close proximity or just prior to the interconnect destination. In an alternative embodiment, it may be convenient to position a first swizzling, in close proximity to the interconnect source—either, both or neither of these alternative options chosen according to the particular design.

As previously noted, in addition to those presented above, numerous other combinations of elements from cyclic swizzle groups form repeatable swizzling patterns, for example, with $C^3$ referring to swizzling 1043, with $c^7$ referring to swizzling 1047, and with $d^7$ referring to swizzling 1057, swizzling patterns may be employed for capacitive and inductive noise cancellation as follows: $C^3,C^3,C^3$, $C^7$; $C^5,C^5,C^5,C^1$; $C^7,C^7,C^7,C^3$; $d^1,d^2,d^3,d^2,d^3,d^3,d^3,d^7$; $d^7,d^7,d^7,d^3$ and so forth.

Figure 11A:
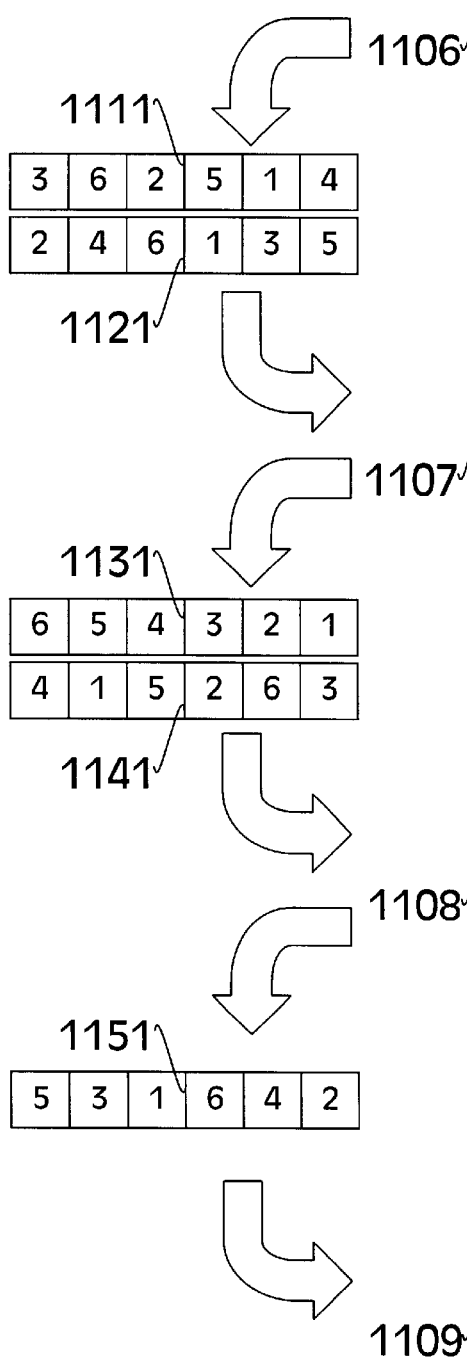
FIG. 11a illustrates an alternative embodiment of a method for calculating a repeatable swizzling pattern for capacitive and inductive noise cancellation on a set of six signal lines.

FIG. 11a illustrates an alternative embodiment of a method for calculating a repeatable swizzling pattern for capacitive and inductive noise cancellation on a set of six signal lines. Each of the rows and columns of matrix 1106 are labeled for a particular signal line 1–6. This time, matrix 1106 is initialized along its diagonal with a capacitive and inductive noise cancellation target value of 2 and the rest of the entries of matrix 1106 are initialized according to the number of times a signal line is adjacent to another signal line in the initial order {1,2,3,4,5,6} of the set.

An alternative capacitive and inductive noise cancellation metric, m, may be set forth as follows:

$$m=50-\Sigma_{for\ 1\leq i,j\leq 6}|\text{entry}(i,i)-\text{entry}(i,j)|.$$

Swizzle stage 1111 and 1121 are computed composing a with itself as before to increase the capacitive and inductive noise cancellation metric, m. Since in swizzle stage 1111, the order {3,6,2,5,1,4} places 1 next to 4 and 5, 2 next to 5 and 6, 3 next to 6, 4 next to 1, 5 next to 1 and 2, and 6 next to 2 and 3; and in swizzle stage 1121, the order {2,4,6,1,3,5} places 1 next to 3 and 6, 2 next to 4, 3 next to 1 and 5, 4 next to 2 and 6, 5 next to 3, and 6 next to 1 and 4; the corresponding entries in matrix 1107 are changed from 0 to 1, resulting in a capacitive and inductive noise cancellation metric of m=20.

Swizzle stages 1131 and 1141 are computed by repeated composition of a to increase the capacitive and inductive noise cancellation metric, m. Since in swizzle stage 1131, the order {6,5,4,3,2,1} places all signal lines in reversed initial order; and in swizzle stage 1141, the order {4,1,5,2,6,3} places 1 next to 4 and 5, 2 next to 5 and 6, 3 next to 6, 4 next to 1, 5 next to 1 and 2, and 6 next to 2 and 3 the corresponding entries in matrix 1108 are changed from 1 to 2, resulting in a capacitive and inductive noise cancellation metric of m=40.

Similarly, swizzle stage 1151 is computed by composition of a to increase the capacitive and inductive noise cancellation metric, m. Since in swizzle stage 1151, the order {5,3,1,6,4,2} places 1 next to 3 and 6, 2 next to 4, 3 next to 1 and 5, 4 next to 2 and 6, 5 next to 3, and 6 next to 1 and 4; the corresponding entries in matrix 1109 are changed from 1 to 2, resulting in a capacitive and inductive noise cancellation metric of m=50.

Since no further increase in the capacitive and inductive noise cancellation metric is available, the swizzling pattern is complete. An optional swizzling to restore the set's original order may also be accomplished by composition of a again with swizzle stage 1151.

Figure 11B:
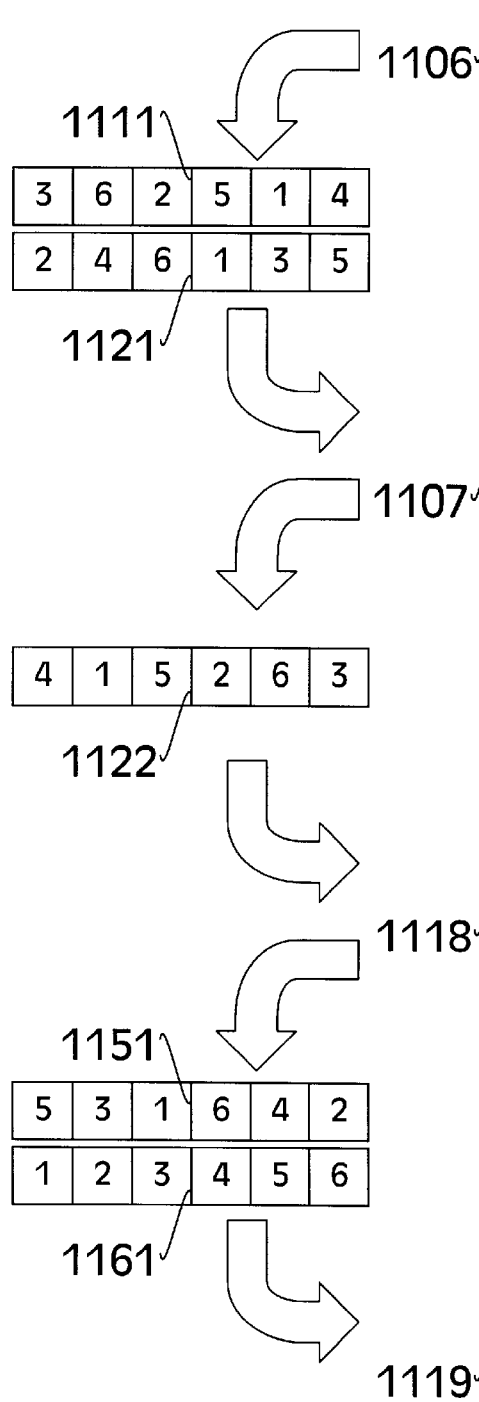
FIG. 11b illustrates another alternative embodiment of a method for calculating a repeatable swizzling pattern for capacitive and inductive noise cancellation on a set of six signal lines.

FIG. 11b illustrates another alternative embodiment of a method for calculating a repeatable swizzling pattern for capacitive and inductive noise cancellation on a set of six signal lines. Swizzle stage 1111 and 1121 are computed as before to increase the capacitive and inductive noise cancellation metric, m, and the corresponding entries in matrix 1107 are updated resulting in a capacitive and inductive noise cancellation metric of m=20.

Swizzle stage 1122 is then computed by composition of $a^2$ to increase the capacitive and inductive noise cancellation metric, m. Since in swizzle stage 1122, the order {4,1,5,2,6,3} places 1 next to 4 and 5, 2 next to 5 and 6, 3 next to 6, 4 next to 1, 5 next to 1 and 2, and 6 next to 2 and 3 the corresponding entries in matrix 1118 are changed from 1 to 2, resulting in a capacitive and inductive noise cancellation metric of m=30.

Swizzle stages 1151 and 1161 are computed by composition of a to increase the capacitive and inductive noise cancellation metric, m. Since in swizzle stage 1151, the order {5,3,1,6,4,2} places 1 next to 3 and 6, 2 next to 4, 3 next to 1 and 5, 4 next to 2 and 6, 5 next to 3, and 6 next to 1 and 4; and in swizzle stage 1161, the order {1,2,3,4,5,6} places all signal lines in their initial order; the corresponding entries in matrix 1119 are changed from 1 to 2, resulting in a capacitive and inductive noise cancellation metric of m=50. Since no further increase in the capacitive and inductive noise cancellation metric is available, the swizzling pattern is complete.

Figure 11C:
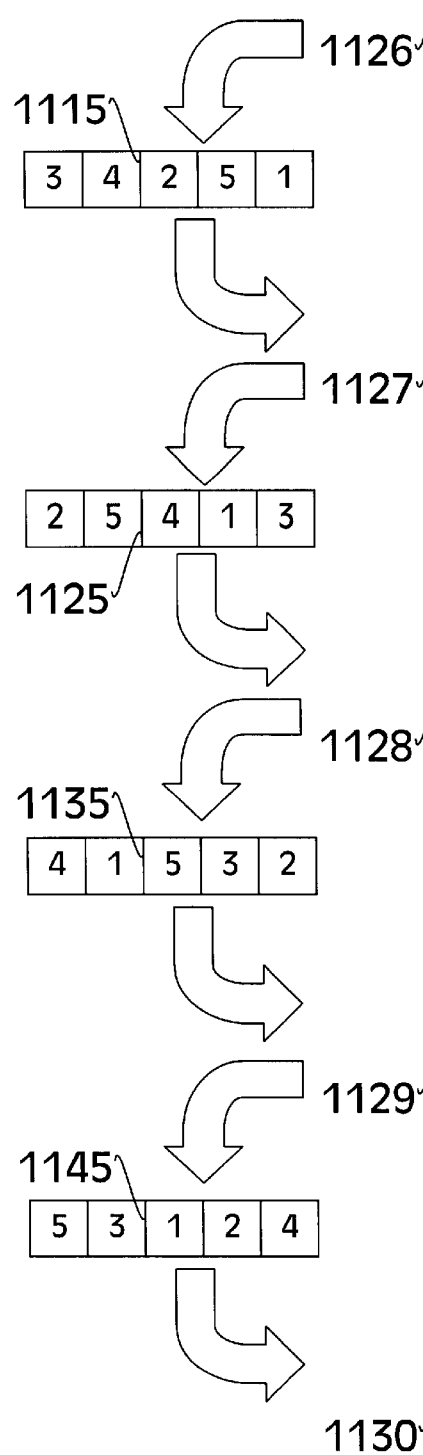
FIG. 11c illustrates an alternative embodiment of a method for calculating a repeatable swizzling pattern for capacitive and inductive noise cancellation on a set of five signal lines.

FIG. 11c illustrates an alternative embodiment of a method for calculating a repeatable swizzling pattern for capacitive and inductive noise cancellation on a set of five signal lines. An alternative capacitive and inductive noise cancellation metric, m, may be set forth as follows:

$$m=32-\Sigma_{for\ 1\leq i,j\leq 5}|\text{entry}(i,i)-\text{entry}(i,j)|.$$

Swizzle stage 1115, {3,4,2,5,1}, is computed as before to increase the capacitive and inductive noise cancellation metric, m, and the corresponding entries in matrix 1127 are updated resulting in a capacitive and inductive noise cancellation metric of m=8.

Swizzle stage 1125 is then computed by composition of swizzle stage 1115 with itself to increase the capacitive and inductive noise cancellation metric, m. Since in swizzle stage 1125, the order {2,5,4,1,3} places 1 next to 3 and 4, 2 next to 5, 3 next to 1, 4 next to 1 and 5, and 5 next to 2 and 4 the corresponding entries in matrix 1128 are incremented, resulting in a capacitive and inductive noise cancellation metric of m=16.

Swizzle stage 1135 is then computed by composition of swizzle stage 1115 with swizzle stage 1125 to increase the capacitive and inductive noise cancellation metric, m. Since in swizzle stage 1135, the order {4,1,5,3,2} places 1 next to 4 and 5, 2 next to 3, 3 next to 2 and 5, 4 next to 1, and 5 next to 1 and 3 the corresponding entries in matrix 1129 are incremented, resulting in a capacitive and inductive noise cancellation metric of m=24.

Swizzle stage 1145 is computed by composition of swizzle stage 1115 with swizzle stage 1135 to increase the capacitive and inductive noise cancellation metric, m. Since in swizzle stage 1145, the order {5,3,1,2,4} places 1 next to 2 and 3, 2 next to 1 and 4, 3 next to 1 and 5, 4 next to 2, and 5 next to 3, the corresponding entries in matrix 1129 are changed from 1 to 2, resulting in a capacitive and inductive noise cancellation metric of m=32. Since no further increase in the capacitive and inductive noise cancellation metric is available, the swizzling pattern is complete except for an optional swizzling to restore the initial order of the set.

Figure 12A:
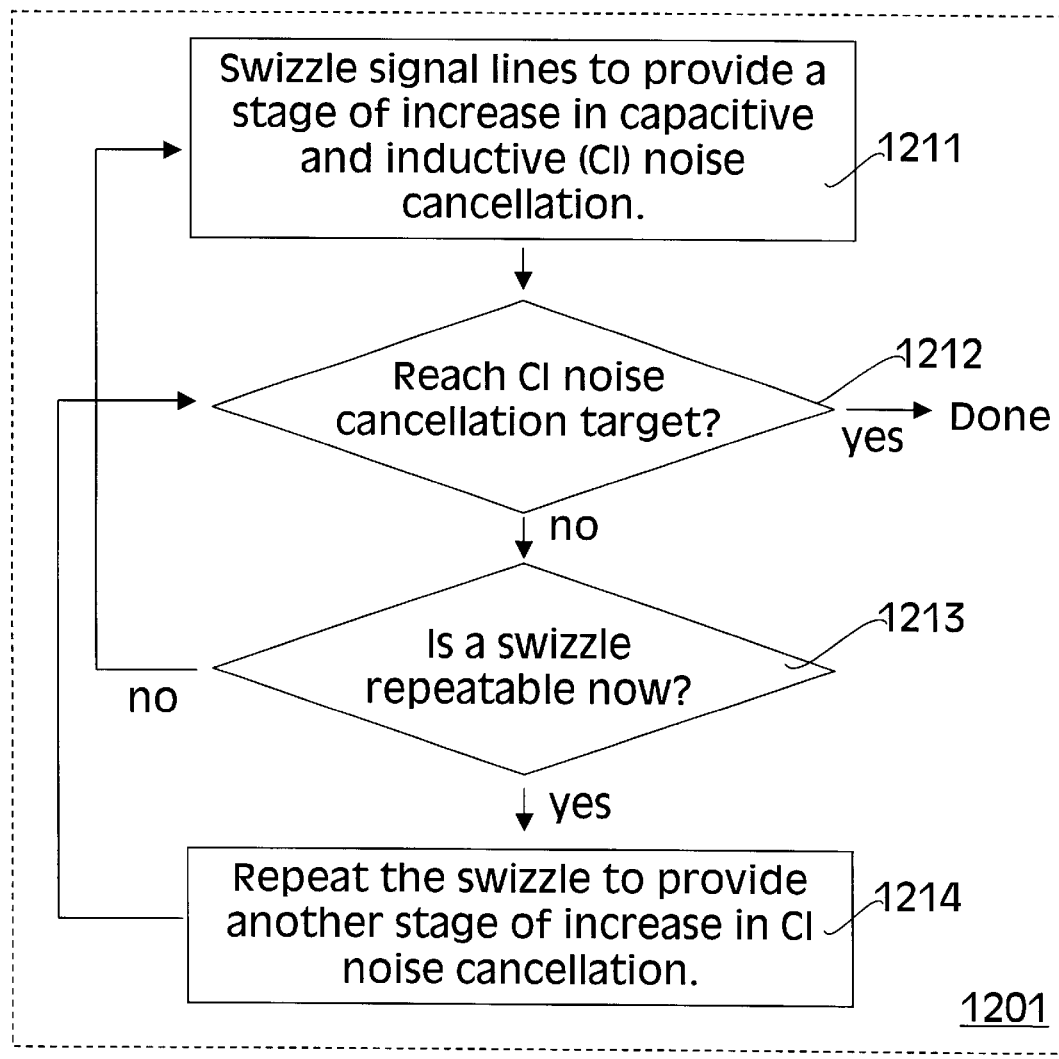
FIG. 12a illustrates a flow diagram for one embodiment of a process to employ repeatable swizzling patterns for capacitive and inductive noise cancellation on a set of signal lines.

FIG. 12a illustrates a flow diagram for one embodiment of a process 1201 to employ repeatable swizzling patterns for capacitive and inductive noise cancellation on a set of signal lines. In processing block 1211 signal lines of a set of signal lines are swizzled to provide a stage of increase in capacitive and inductive noise cancellation. Processing continues in processing block 1212 where a check is performed to see if the capacitive and inductive (CI) noise cancellation target has been reached. If so, process 1201 terminates from processing block 1212. Otherwise, processing continues in processing block 1213 where a check is performed to see if a swizzle is repeatable for producing the next stage. If so, processing continues in processing block 1214 where the repeatable swizzle is repeated to provide another stage of increase in capacitive and inductive noise cancellation. Otherwise, processing continues in processing block 1211 where signal lines of the set are swizzled again to provide another stage of increase in capacitive and inductive noise cancellation. Processing then returns to processing block 1212 until the capacitive and inductive (CI) noise cancellation target has been reached, which finally terminates process 1201 from processing block 1212.

It will be appreciated that in such cases where the order of the set of signal lines after one or more applications of process 1201 is not the same as the initial order of the set of signal lines, an additional swizzle stage may optionally be employed to restore the initial order of the set.

Figure 12B:
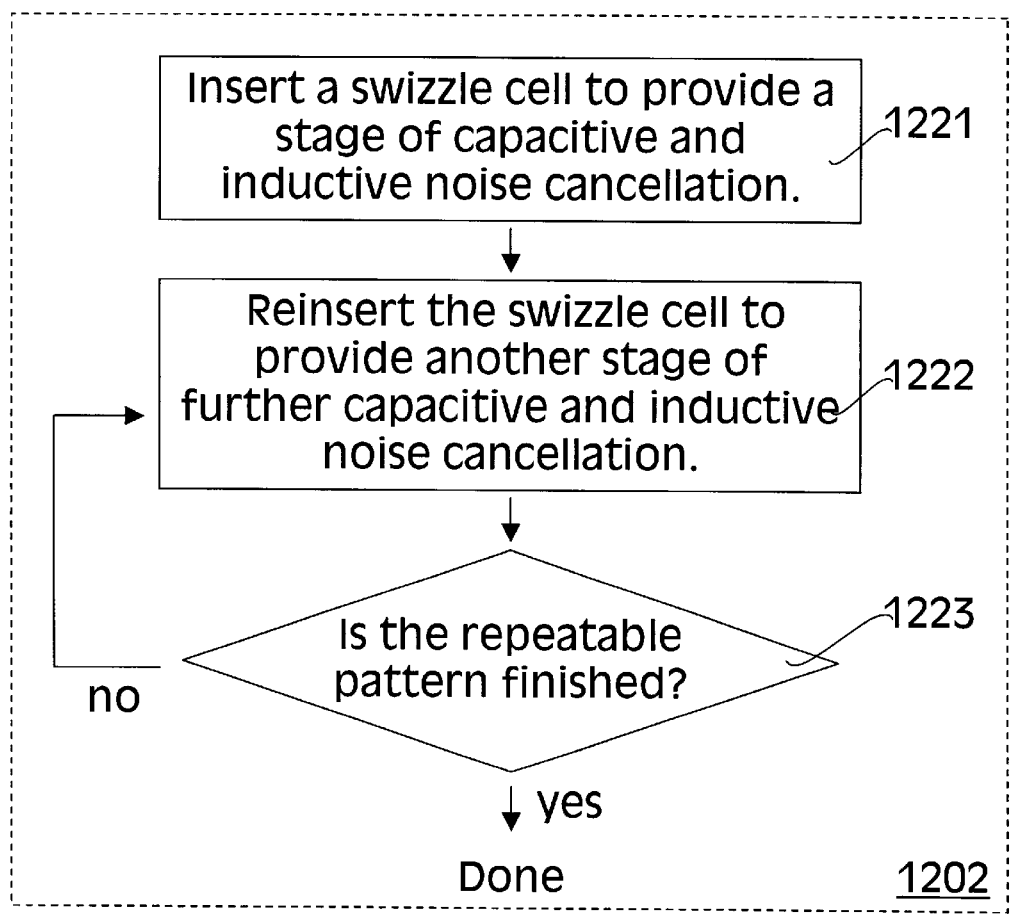
FIG. 12b illustrates a flow diagram for an alternative embodiment of a process to employ repeatable swizzling patterns for capacitive and inductive noise cancellation on a set of signal lines.

FIG. 12b illustrates a flow diagram for an alternative embodiment of a process 1202 to employ repeatable swizzling patterns for capacitive and inductive noise cancellation on a set of signal lines. In processing block 1221 a swizzle cell is inserted for a set of signal lines, having an initial order, to provide a stage of capacitive and inductive noise cancellation. Processing continues in processing block 1222 where the swizzle cell is reinserted for the set of signal lines to provide another stage of further capacitive and inductive noise cancellation. In processing block 1223 a check is performed to see if the repeatable swizzling pattern is finished. If not, processing continues in processing block 1222 and the swizzle cell is reinserted again to provide another stage of further capacitive and inductive noise cancellation. Otherwise, the process terminates from processing block 1223. An additional swizzle stage may optionally be employed to restore the initial order of the set.

Figure 13A:
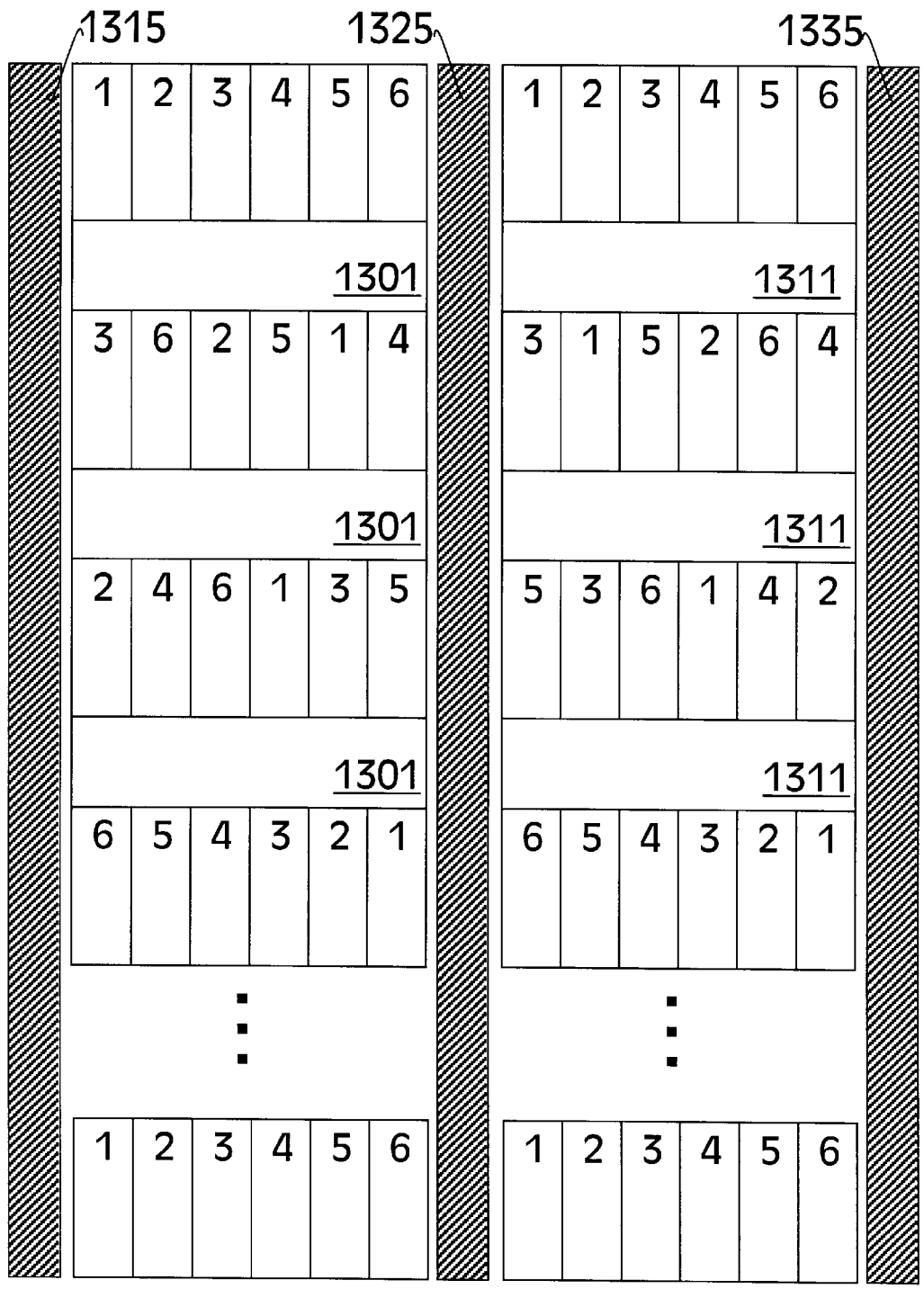
FIG. 13a illustrates one embodiment of an apparatus comprising repeatable swizzling patterns for capacitive and inductive noise cancellation on sets of six signal lines.

FIG. 13a illustrates one embodiment of an apparatus comprising repeatable swizzling patterns for capacitive and inductive noise cancellation on sets of six signal lines. A repeatable swizzle cell 1301 provides a swizzling for capacitive and inductive noise cancellation on a set of six signal lines between shielding 1315 and shielding 1325, the set having an initial order {1,2,3,4,5,6}. Swizzle cell 1301 may comprise at least two layers of metal traces and vias to establish conductive connections between the metal layers. Since swizzle cell 1301 may be efficiently designed once but reused many times, the repetition of use provides for cost and labor savings and the efficiency of design provides for area and complexity savings in the interconnect design. Signal line 1 is swizzled to place it next to signal lines 4 and 5 for capacitive and inductive noise cancellation. Signal line 2 is swizzled to place it next to signal lines 5 and 6; signal line 3 is swizzled to place it next to signal line 6; signal line 4 is swizzled to place it next to signal lines 1; signal line 5 is swizzled to place it next to signal lines 1 and 2; and signal line 6 is swizzled to place it next to signal lines 2 and 3 thereby providing a first swizzle stage for capacitive and inductive noise cancellation having an order {3,6,2,5,1,4}.

It will be appreciated that swizzle cell 1301 and other repeatable swizzle cells may be inserted repeatedly into an interconnect to employ a swizzling pattern. For example, swizzle cell 1301 may be reinserted into the interconnect as illustrated to provide another swizzle stage for further capacitive and inductive noise cancellation having an order {2,4,6,1,3,5}. Similarly, swizzle cell 1301 may be reinserted as illustrated to provide yet another swizzle stage for further capacitive and inductive noise cancellation having an order {6,5,4,3,2,1}. Swizzle cell 1301 may be repeatedly inserted in this manner three more times, thereby completing the swizzling pattern and restoring the sets initial order {1,2,3,4,5,6}.

It will be appreciated that other repeatable swizzling patterns are possible as well. For example, a repeatable swizzle cell 1311 provides a swizzling for capacitive and inductive noise cancellation on another set of six signal lines between shielding 1325 and shielding 1335, this set also having an initial order {1,2,3,4,5,6}. Signal line 1 is swizzled to place it next to signal lines 3 and 5 for capacitive and inductive noise cancellation. Signal line 2 is swizzled to place it next to signal lines 5 and 6; signal line 3 is swizzled to place it next to signal line 1; signal line 4 is swizzled to place it next to signal lines 6; signal line 5 is swizzled to place it next to signal lines 1 and 2; and signal line 6 is swizzled to place it next to signal lines 2 and 4 thereby providing a first swizzle stage for capacitive and inductive noise cancellation having an order {3,1,5,2,6,4}.

Swizzle cell 1311 may be reinserted into the interconnect as illustrated to provide another swizzle stage for further capacitive and inductive noise cancellation having an order {5,3,6,1,4,2}. Similarly, swizzle cell 1311 may be reinserted as illustrated to provide yet another swizzle stage for further capacitive and inductive noise cancellation having an order {6,5,4,3,2,1}, and may be repeatedly inserted in this manner three more times, thereby completing the swizzling pattern and restoring the sets initial order {1,2,3,4,5,6}.

Figure 13B:
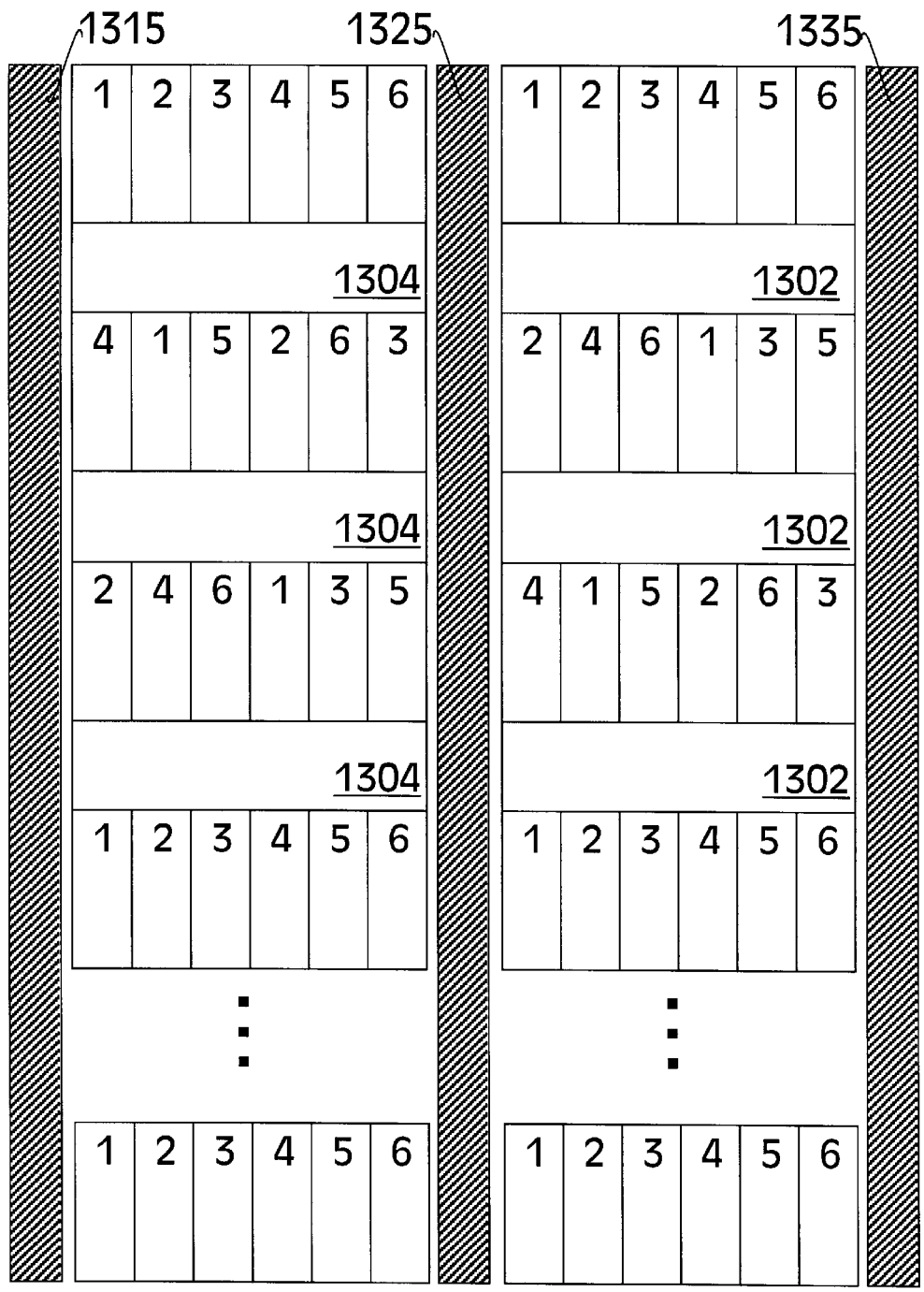
FIG. 13b illustrates an alternative embodiment of an apparatus comprising repeatable swizzling patterns for capacitive and inductive noise cancellation on sets of six signal lines.

FIG. 13b illustrates an alternative embodiment of an apparatus comprising repeatable swizzling patterns for capacitive and inductive noise cancellation on sets of six signal lines. For the current embodiment, repeatable swizzle cell 1304 provides a swizzling for capacitive and inductive noise cancellation on a set of six signal lines between shielding 1315 and shielding 1325, the set having an initial order {1,2,3,4,5,6}. Signal line 1 is swizzled to place it next to signal lines 4 and 5 for capacitive and inductive noise cancellation. Signal line 2 is swizzled to place it next to signal lines 5 and 6; signal line 3 is swizzled to place it next to signal line 6; signal line 4 is swizzled to place it next to signal lines 1; signal line 5 is swizzled to place it next to signal lines 1 and 2; and signal line 6 is swizzled to place it next to signal lines 2 and 3 thereby providing a first swizzle stage for capacitive and inductive noise cancellation having an order {4,1,5,2,6,3}.

Swizzle cell 1304 may be reinserted into the interconnect as illustrated to provide another swizzle stage for further capacitive and inductive noise cancellation having an order {2,4,6,1,3,5}. Similarly, swizzle cell 1304 may be reinserted as illustrated, thereby completing the swizzling pattern and restoring the sets initial order {1,2,3,4,5,6}. If convenient, the same swizzling pattern may be employed again in the same set of signal lines or in other sets of signal lines.

Alternatively, different repeatable swizzling patterns may be employed as well. For example, repeatable swizzle cell 1302 provides a swizzling for capacitive and inductive noise cancellation on another set of six signal lines between shielding 1325 and shielding 1335, this set also having an initial order {1,2,3,4,5,6}. Signal line 1 is swizzled to place it next to signal lines 3 and 6 for capacitive and inductive noise cancellation. Signal line 2 is swizzled to place it next to signal line 4; signal line 3 is swizzled to place it next to signal lines 1 and 5; signal line 4 is swizzled to place it next to signal lines 2 and 6; signal line 5 is swizzled to place it next to signal line 3; and signal line 6 is swizzled to place it next to signal lines 1 and 4 thereby providing a first swizzle stage for capacitive and inductive noise cancellation having an order {2,4,6,1,3,5}.

Swizzle cell 1302 may be reinserted into the interconnect as illustrated to provide another swizzle stage for further capacitive and inductive noise cancellation having an order {4,1,5,2,6,3}. Similarly, swizzle cell 1302 may be reinserted as illustrated, thereby completing the swizzling pattern and restoring the sets initial order {1,2,3,4,5,6}.

Figure 13C:
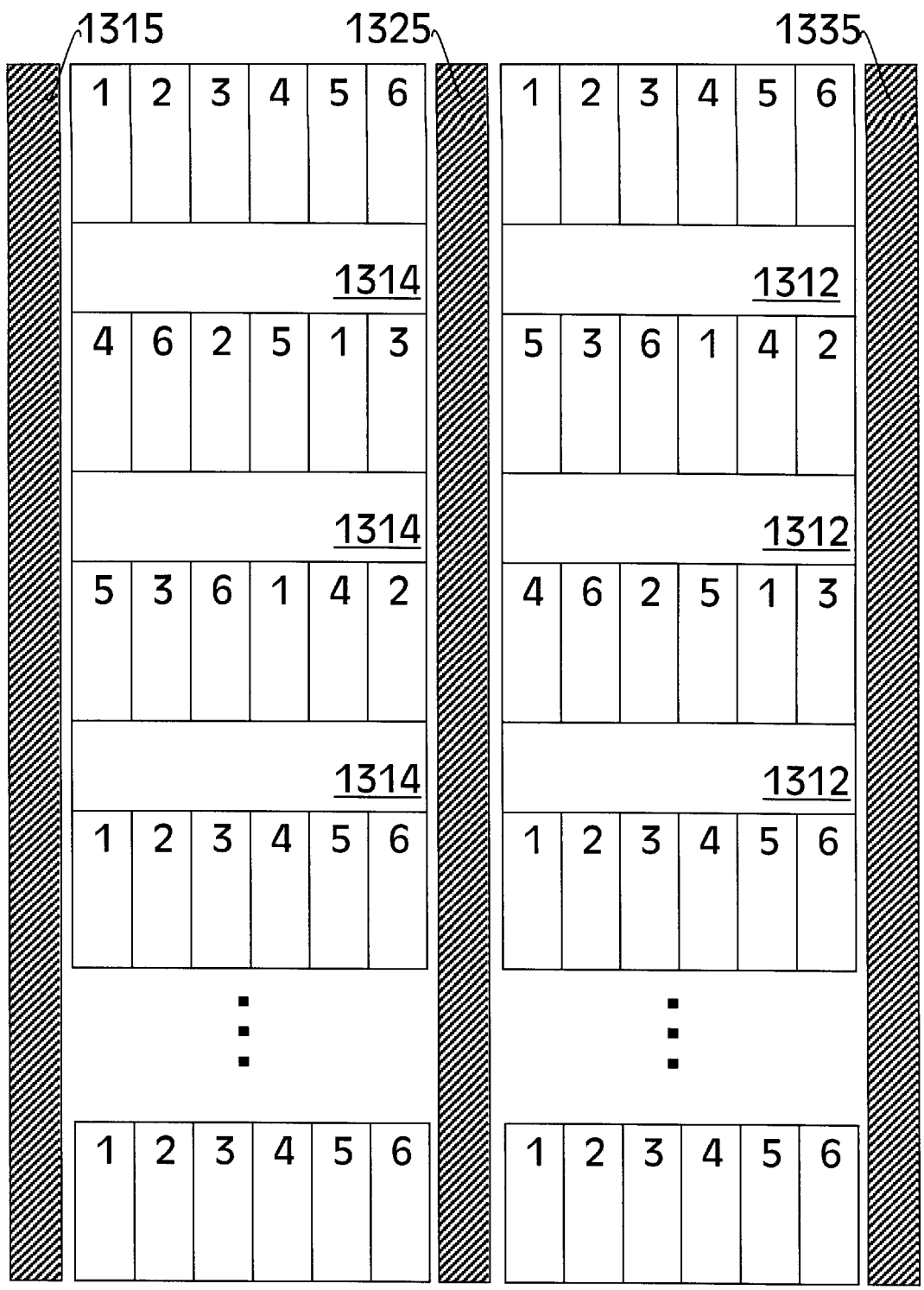
FIG. 13c illustrates another alternative embodiment of an apparatus comprising repeatable swizzling patterns for capacitive and inductive noise cancellation on sets of six signal lines.

FIG. 13c illustrates another alternative embodiment of an apparatus comprising repeatable swizzling patterns for capacitive and inductive noise cancellation on sets of six signal lines. For the current embodiment, repeatable swizzle cell 1314 provides a swizzling for capacitive and inductive noise cancellation on a set of six signal lines between shielding 1315 and shielding 1325, the set having an initial order {1,2,3,4,5,6}. Signal line 1 is swizzled to place it next to signal lines 3 and 5 for capacitive and inductive noise cancellation. Signal line 2 is swizzled to place it next to signal lines 5 and 6; signal line 3 is swizzled to place it next to signal line 1; signal line 4 is swizzled to place it next to signal line 6; signal line 5 is swizzled to place it next to signal lines 1 and 2; and signal line 6 is swizzled to place it next to signal lines 2 and 4 thereby providing a first swizzle stage for capacitive and inductive noise cancellation having an order {4,6,2,5,1,3}.

Swizzle cell 1314 may be reinserted into the interconnect as illustrated to provide another swizzle stage for further capacitive and inductive noise cancellation having an order {5,3,6,1,4,2}. Similarly, swizzle cell 1314 may be reinserted as illustrated, thereby completing the swizzling pattern and restoring the sets initial order {1,2,3,4,5,6}, and if convenient, the pattern may be employed again in the same set of signal lines or in other sets of signal lines.

Alternatively, a repeatable swizzle cell 1312 may be employed to provide a swizzling for capacitive and inductive noise cancellation on another set of six signal lines between shielding 1325 and shielding 1335, this set also having an initial order {1,2,3,4,5,6}. Signal line 1 is swizzled to place it next to signal lines 4 and 6 for capacitive and inductive noise cancellation. Signal line 2 is swizzled to place it next to signal line 4; signal line 3 is swizzled to place it next to signal lines 5 and 6; signal line 4 is swizzled to place it next to signal lines 1 and 2; signal line 5 is swizzled to place it next to signal line 3; and signal line 6 is swizzled to place it next to signal lines 1 and 3 thereby providing a first swizzle stage for capacitive and inductive noise cancellation having an order {5,3,6,1,4,2}.

Swizzle cell 1312 may be reinserted into the interconnect as illustrated to provide another swizzle stage for further capacitive and inductive noise cancellation having an order {4,6,2,5,1,3}. Similarly, swizzle cell 1312 may be reinserted as illustrated, thereby completing the swizzling pattern and restoring the sets initial order {1,2,3,4,5,6}.

Figure 13D:
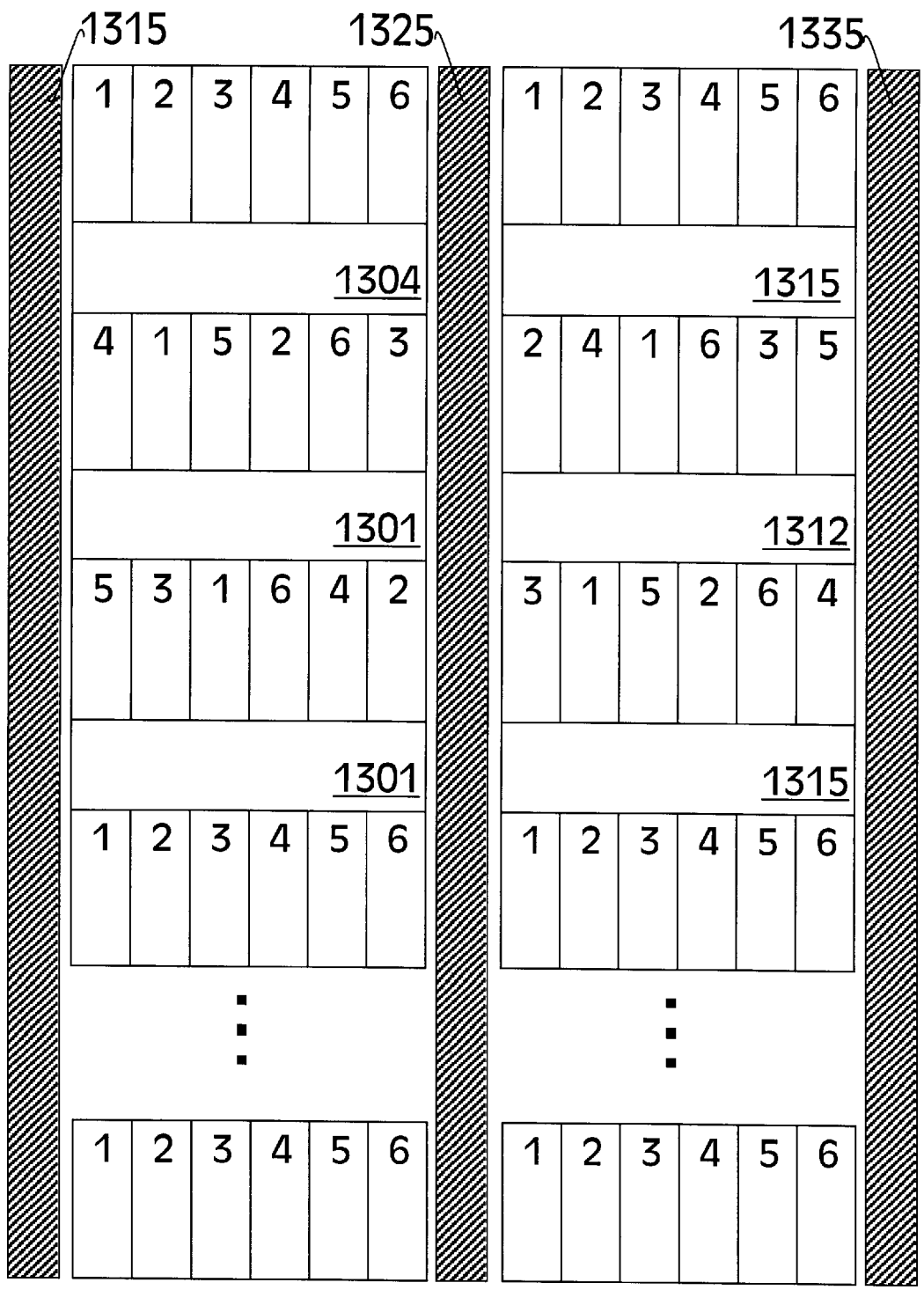
FIG. 13d illustrates another alternative embodiment of an apparatus comprising repeatable swizzling patterns for capacitive and inductive noise cancellation on sets of six signal lines.

FIG. 13d illustrates another alternative embodiment of an apparatus comprising repeatable swizzling patterns for capacitive and inductive noise cancellation on sets of six signal lines. For the current embodiment, repeatable swizzle cell 1304 provides a first swizzle stage for capacitive and inductive noise cancellation having an order {4,1,5,2,6,3}.

Repeatable swizzle cell 1301 may then be inserted into the interconnect as illustrated to provide another swizzle stage for further capacitive and inductive noise cancellation having an order {5,3,1,6,4,2}. Swizzle cell 1301 may then be reinserted as illustrated, thereby completing the swizzling pattern and restoring the sets initial order {1,2,3,4,5,6}, and if convenient, the pattern may be employed again in the same set of signal lines or in other sets of signal lines.

Alternatively, repeatable swizzle cell 1315 may be employed to provide a swizzling for capacitive and inductive noise cancellation on another set of six signal lines between shielding 1325 and shielding 1335, thereby providing a first swizzle stage for capacitive and inductive noise cancellation having an order {2,4,1,6,3,5}.

Repeatable swizzle cell 1312 may then be inserted into the interconnect as illustrated to provide another swizzle stage for further capacitive and inductive noise cancellation having an order {3,1,5,2,6,4}. Swizzle cell 1315 may then be reinserted as illustrated, thereby completing the swizzling pattern and restoring the sets initial order {1,2,3,4,5,6}.

It will also be appreciated that the methods herein disclosed or methods substantially similar to those herein disclosed may be implemented in one of many programming languages (including but not limited to C and C++) for performing automated computations (including but not limited to providing capacitive and inductive noise cancellation for signal lines of an interconnect, calculating swizzling patterns for capacitive and inductive noise cancellation, and inserting repeatable swizzling cells in sets of signal lines of an interconnect) using high-speed computing devices. Preferred embodiments of such implementations may provide for arguments to specify, for example, capacitive and inductive noise cancellation metrics, capacitive and inductive noise cancellation targets, swizzle groups, and swizzle library cells.

Figure 14:
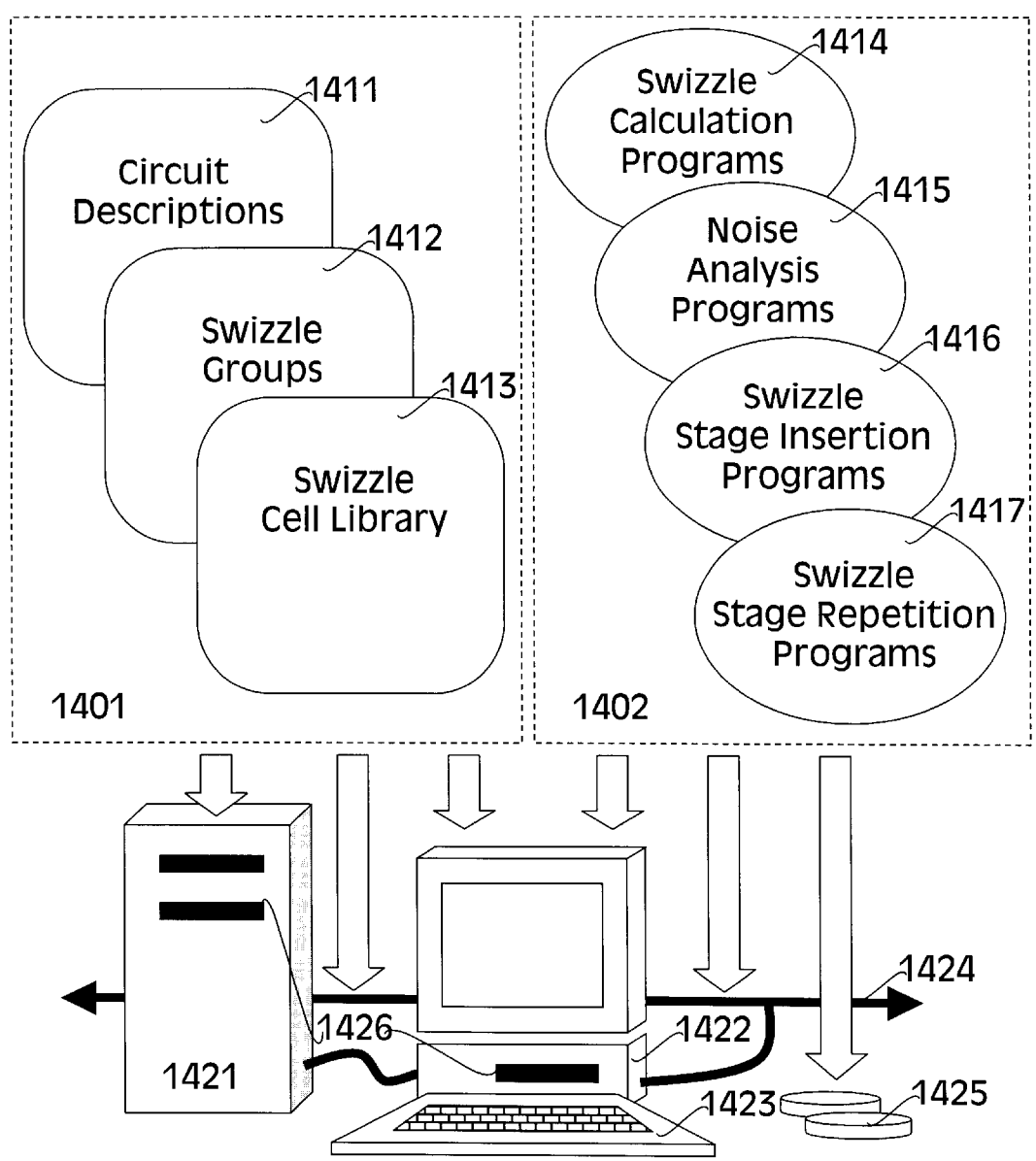
FIG. 14 illustrates one embodiment of an automated design system to calculate and employ swizzling patterns for capacitive and inductive noise cancellation.

For example, FIG. 14 illustrates one embodiment of an automated design system to employ swizzling patterns for capacitive and inductive noise cancellation. Automated design system 1422 is connectable with various storage, transmission and I/O devices to receive data structures and programmed methods. Representative data structures 1401 may include but are not limited to circuit descriptions 1411, swizzle groups 1412, and swizzle cell library 1413. Representative programmed methods 1402 may include but are not limited to swizzle calculation programs 1414, noise analysis programs 1415, swizzle stage insertion programs 1416, and swizzle stage repetition programs 1417. Components of either or both of the data structures and programmed methods may be stored or transmitted on devices such as removable storage disks 1425, which may be accessed through an access device 1426 in automated design system 1422 or in a storage serving system 1421. Storage serving system 1421 or automated design system 1422 may also include other removable storage devices or non-removable storage devices suitable for storing or transmitting data structures 1401 or programmed methods 1402. Component data structures and programmed methods may also be stored or transmitted on devices such as network 1424 for access by automated design system 1422 or entered by users through I/O device 1423.

It will be appreciated that systems such as the one illustrated are commonly available and widely used in the art of designing integrated systems including interconnects. It will also be appreciated that the complexity, capabilities, and physical forms of such design systems improves and changes rapidly, and therefore understood that the design system illustrated is by way of example and not limitation The above description is intended to illustrate preferred embodiments of the present invention. From the discussion above it should also be apparent that the invention may be modified in arrangement and detail by those skilled in the art without departing from the principles of the present invention within the scope of the accompanying claims.

What is claimed is:

1. A method comprising:
    calculating a first swizzle stage to increase a capacitive and inductive noise cancellation metric for a set of N signal lines;
    identifying if further capacitive and inductive noise cancellation is needed to reach a cancellation target; and
    calculating another swizzle stage to further increase the capacitive and inductive noise cancellation metric for the set of N signal lines if needed to reach the cancellation target.

2. The method of claim 1 wherein a first signal line of the set is adjacent to a first subset of the set of N signal lines in the first swizzle stage and another swizzle stage is calculated to place the first signal line adjacent to a second subset of signal lines in a second swizzle stage, the first subset and the second subset being disjoint.

3. The method of claim 2 wherein the first signal line of the set is adjacent to a third subset of the set of signal lines in an initial order of the set of N signal lines and the first swizzle stage places the first signal line adjacent to the first subset of signal lines, the first subset and the third subset being disjoint.

4. The method of claim 3 wherein the first subset, the second subset and the third subset are disjoint.

5. The method of claim 4 further comprising:
calculating a third swizzle stage to restore the initial order of the set of N signal lines.

6. The method of claim 1 wherein another swizzle stage is calculated to further increase the capacitive and inductive noise cancellation metric by composing the first swizzle stage with itself.

7. The method of claim 1 comprising calculating S swizzle stages to increase the capacitive and inductive noise cancellation metric for the set of N signal lines, wherein each of the N signal lines of the set is placed adjacent to every other signal line of the set in some stage of the S stages, and optionally providing an additional stage to restoring an initial order of the set.

8. The method of claim 7, S being related to N according to the equation:

$$N^2/2-(2S+3)N/2+S+1=0.$$

9. The method of claim 7 wherein a plurality of swizzle stages are calculated by compositions of the first swizzle stage.

10. An article of manufacture comprising
a machine-accessible medium including data that, when accessed by a machine, cause the machine to perform the method of claim 9.

11. An article of manufacture comprising
a machine-accessible medium including data that, when accessed by a machine, cause the machine to perform the method of claim 7.

12. An article of manufacture comprising
a machine-accessible medium including data that, when accessed by a machine, cause the machine to perform the method of claim 4.

13. An article of manufacture comprising
a machine-accessible medium including data that, when accessed by a machine, cause the machine to perform the method of claim 1.

14. The method of claim 1 wherein the first swizzle stage and the second swizzle stage each increase the capacitive and inductive noise cancellation metric by a stage cancellation limit amount.

15. The method of claim 1 wherein said another swizzle stage is calculated to place no signal line, of the set of N signal lines, adjacent to one of the same signal lines that they are adjacent to in the first swizzle stage.

16. The method of claim 15 wherein the first swizzle stage is calculated to place no signal line, of the set of N signal lines, adjacent to one of the same signal lines that they are adjacent to in an initial order of the set of N signal lines.

17. The method of claim 16 wherein said another swizzle stage is calculated to place no signal line, of the set of N signal lines, adjacent to one of the same signal lines that they are adjacent to in the initial order.

18. An article of manufacture comprising:
a machine-accessible medium including data that, when accessed by a machine, provides the machine with:
means for computing a first swizzle stage for a set of N active signal lines to produce a first increase in capacitive and inductive noise cancellation; and;
means for computing a second swizzle stage for the set of N active signal lines to produce a second increase in capacitive and inductive noise cancellation in addition to the first increase.

19. The article of manufacture of claim 18 further comprising:
a machine-accessible medium including data that, when accessed by a machine, provides the machine with means for restoring an initial order of the set of N signal lines.

20. The article of manufacture of claim 19 wherein restoring the initial order of the set of N signal lines produces a third increase in capacitive and inductive noise cancellation in addition to the first and second increases.

21. The article of manufacture of claim 18 further comprising:
a machine-accessible medium including data that, when accessed by a machine, provides the machine with means for computing a capacitive and inductive noise cancellation metric for said first and second increases.

22. The article of manufacture of claim 18 further comprising:
a machine-accessible medium including data that, when accessed by a machine, provides the machine with:
means for computing the first swizzle stage repositioning the set of signal lines to produce the first increase in capacitive and inductive noise cancellation according to a repeatable swizzling pattern; and
means for computing the second swizzle stage repositioning the set of signal lines to produce the second increase in capacitive and inductive noise cancellation according to the repeatable swizzling pattern.

23. The article of manufacture of claim 18 wherein the N active signal lines may each be switched in a single transmission cycle.

24. An article of manufacture comprising:
a machine-accessible medium including data that, when accessed by a machine, cause the machine to:
identify a first swizzle cell to provide a set of N concurrently active signal lines with a first stage of capacitive and inductive noise cancellation; and
identify a second swizzle cell to provide the set of N concurrently active signal lines with a second stage of further capacitive and inductive noise cancellation.

25. The article of manufacture of claim 24 wherein concurrently active indicates that each of the N signal lines may be switched in a single transmission cycle.

26. The article of manufacture of claim 24 wherein a first signal line of the set is adjacent to a first subset of the set of signal lines in the first stage and the second stage places the first signal line adjacent to a second subset of the set of signal lines, the first subset and the second subset being disjoint.

27. The article of manufacture of claim 26 wherein the first swizzle cell and the second swizzle cell are identified to reduce capacitive and inductive noise due to switching within the set of signal lines.

28. The article of manufacture of claim 24 wherein the second stage places no signal line, of the set of N concurrently active signal lines, adjacent to one of the same signal lines that they are adjacent to in the first stage.

29. The article of manufacture of claim 28 wherein the set of N concurrently active signal lines has an original order and the first swizzle stage places no signal line, of the set of N concurrently active signal lines, adjacent to one of the same signal lines that they are adjacent to in the original order.

30. The article of manufacture of claim 29 further including data that when accessed by the machine, cause the machine to:

identify a third swizzle cell to restore the set of signal lines to their original order.

31. The article of manufacture of claim 29 further including data that when accessed by the machine, cause the machine to:

identify one of the first or second swizzle cells to restore the set of signal lines to their original order.

32. The article of manufacture of claim 24 further including data that when accessed by the machine, cause the machine to:

identify the second swizzle cell as a repetition of the first swizzle cell.

33. The article of manufacture of claim 24 further including data that when accessed by the machine, cause the machine to:

identify a plurality of S swizzle cells to provide the set of N concurrently active signal lines with capacitive and inductive noise cancellation within the set, S being related to N according to the equation $$N^2/2-(2S+3)N/2+S+1=0.$$

optionally identify a swizzle cell to restore an initial order for the set of N concurrently active signal lines.

34. An article of manufacture comprising:

a machine-accessible medium including data that, when accessed by a machine, cause the machine to:

compute a plurality of repeatable swizzle cells linking segments of a set of N concurrently active signal lines, the plurality of swizzle cells transposing near victim signal lines and far victim signal lines in subsequent segments to facilitate capacitive and inductive noise cancellation within the set of N concurrently active signal lines; and optionally compute a swizzle cell to restore an initial order for the set of N concurrently active signal lines.

35. The article of manufacture of claim 34 wherein concurrently active indicates that each of the N signal lines may be switched in a single transmission cycle.

* * * * *

UNITED STATES PATENT AND TRADEMARK OFFICE
CERTIFICATE OF CORRECTION

PATENT NO.     : 6,611,944 B2
DATED          : August 26, 2003
INVENTOR(S)    : Elzinga It is certified that error appears in the above-identified patent and that said Letters Patent is hereby corrected as shown below:

Column 6,
Line 26, after the first occurrence of the word "line", delete "2" and insert -- 1 --.
Line 45, after the first occurrence of the word "lines", delete "5" and insert -- 3 --.

Column 8,
Line 19, at the end of the line after the phrase "next to 1", insert -- 2, 5 --.

Column 11,
Line 13, immediately before the word "forth", insert the phrase -- and so --.

Column 12,
Line 34, in the given equation between "6" and "[", delete "|".

Signed and Sealed this

Twentieth Day of January, 2004

JON W. DUDAS
*Acting Director of the United States Patent and Trademark Office*